US006940223B2

(12) United States Patent
Yamazaki

(10) Patent No.: US 6,940,223 B2
(45) Date of Patent: Sep. 6, 2005

(54) FILM FORMING APPARATUS AND METHOD OF MANUFACTURING LIGHT EMITTING DEVICE

(75) Inventor: Shunpei Yamazaki, Tokyo (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 83 days.

(21) Appl. No.: 09/898,067

(22) Filed: Jul. 5, 2001

(65) Prior Publication Data

US 2002/0003397 A1 Jan. 10, 2002

(30) Foreign Application Priority Data

Jul. 10, 2000 (JP) ......................................... 2000-209130

(51) Int. Cl.[7] ................................................. H01R 1/62
(52) U.S. Cl. ...................................................... 313/504
(58) Field of Search ................................. 313/504, 506, 313/507, 509; 257/E51.022, 40, 99, 57, 59, 72, 448; 438/30, 166, 359, 46, 47, 507, 508; 427/557, 66, 68, 64; 345/76, 36, 45; 428/690; 315/169.3, 169.1

(56) References Cited

U.S. PATENT DOCUMENTS

| | | | | |
|---|---|---|---|---|
| 5,431,800 A | | 7/1995 | Kirchhoff et al. | |
| 5,488,266 A | * | 1/1996 | Aoki et al. | 313/509 |
| 5,895,692 A | * | 4/1999 | Shirasaki et al. | 427/557 |
| 6,175,345 B1 | * | 1/2001 | Kuribayashi et al. | 345/76 |
| 6,208,075 B1 | * | 3/2001 | Hung et al. | 313/504 |
| 6,329,215 B1 | * | 12/2001 | Porowski et al. | 438/46 |
| 6,373,455 B1 | * | 4/2002 | Kuribayashi et al. | 345/76 |
| 6,384,427 B1 | * | 5/2002 | Yamazaki et al. | 257/59 |
| 6,420,200 B1 | * | 7/2002 | Yamazaki et al. | 438/30 |
| 6,451,391 B1 | * | 9/2002 | Yamada et al. | 427/586 |

FOREIGN PATENT DOCUMENTS

EP 0 554 117 A3 8/1993

* cited by examiner

Primary Examiner—Alexander Gilman
(74) Attorney, Agent, or Firm—Fish & Richardson P.C.

(57) ABSTRACT

The problem regarding volatileness of a solvent in an EL forming material, which occurs in adopting printing, are solved. An EL layer is formed in a pixel portion of a light emitting device by printing. Upon formation of the EL layer, a printing chamber is pressurized to reach a pressure equal to or higher than the atmospheric pressure, and the printing chamber is filled with inert gas or set to a solvent atmosphere. Thus the difficulty in forming an EL layer by printing is eliminated.

18 Claims, 13 Drawing Sheets

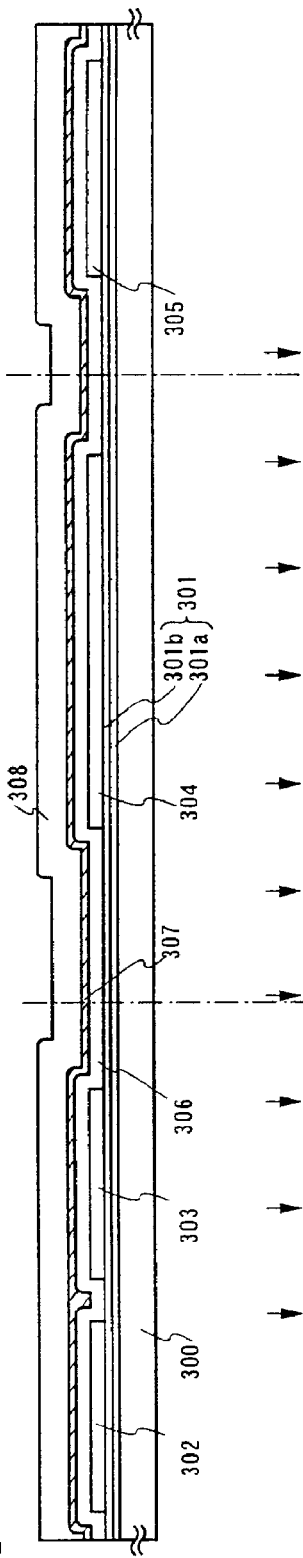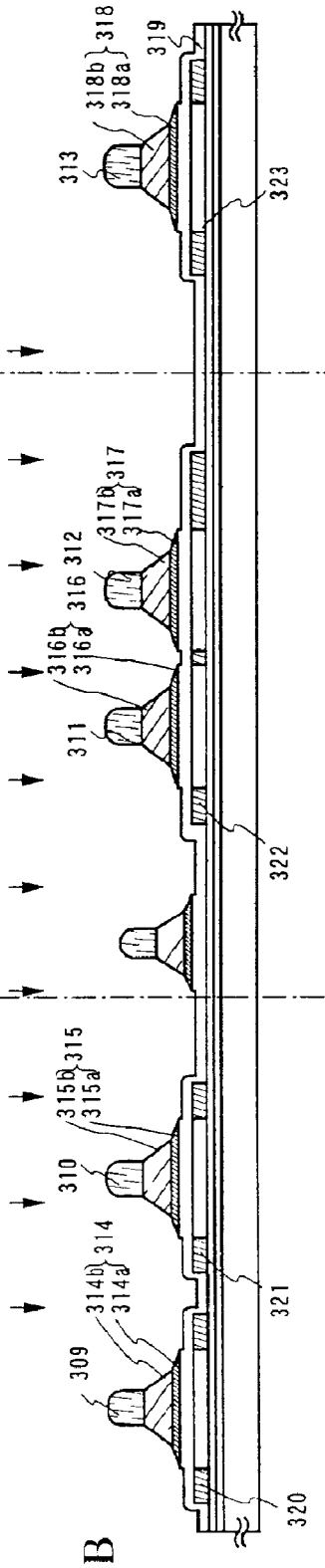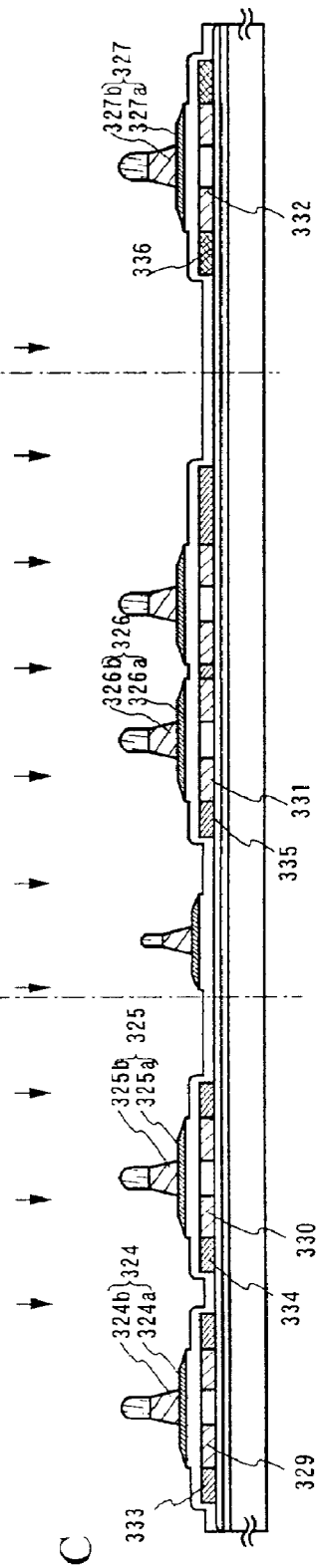

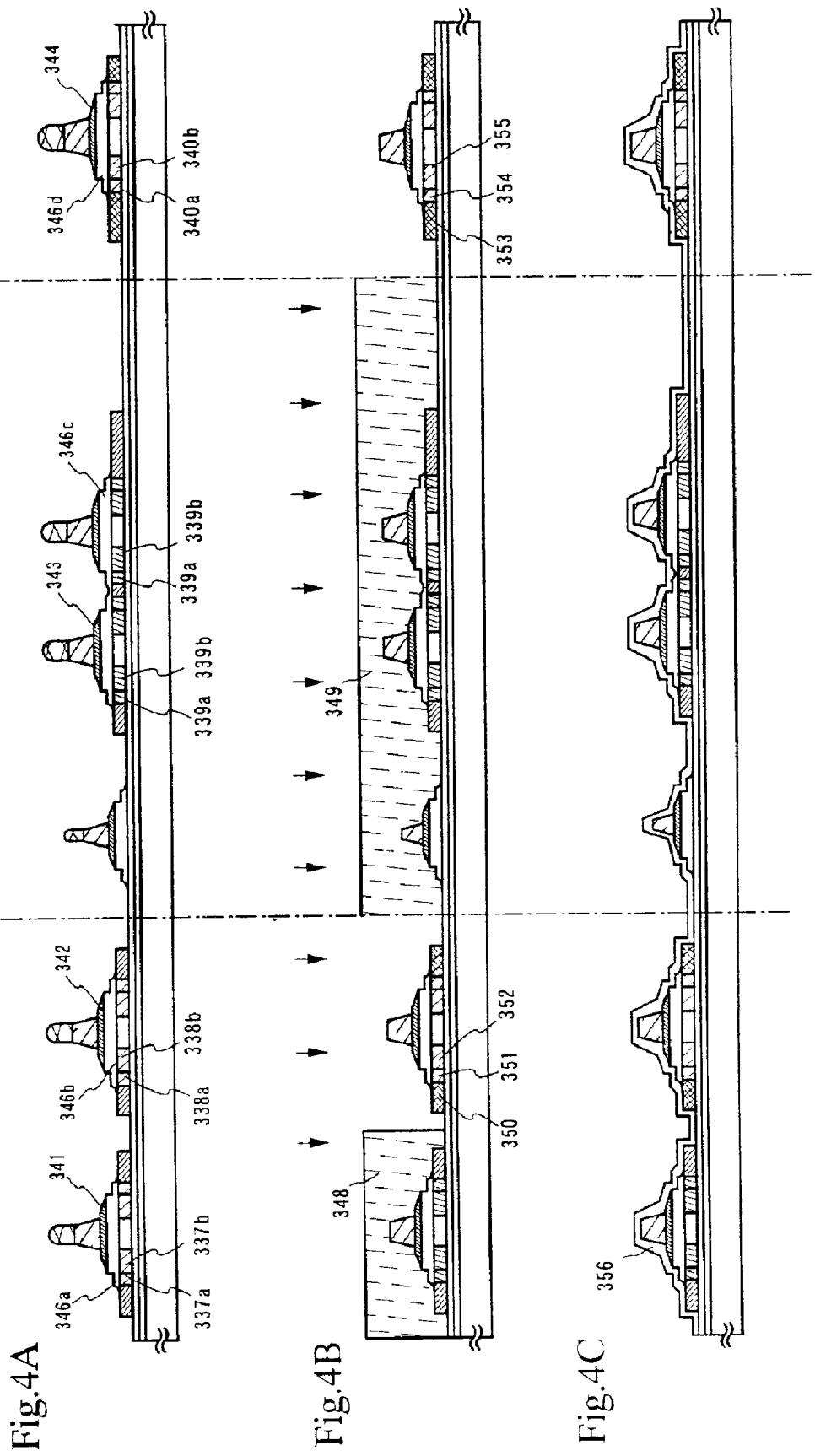

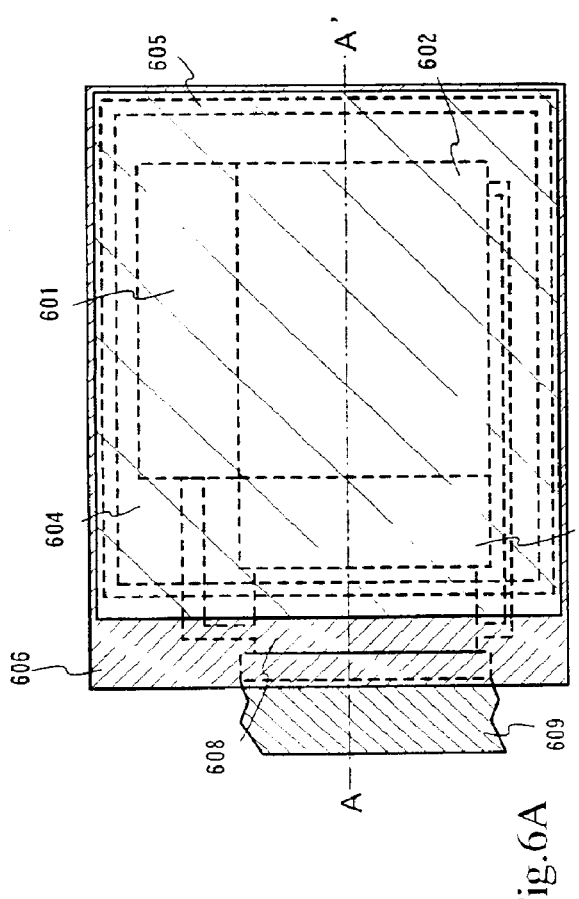
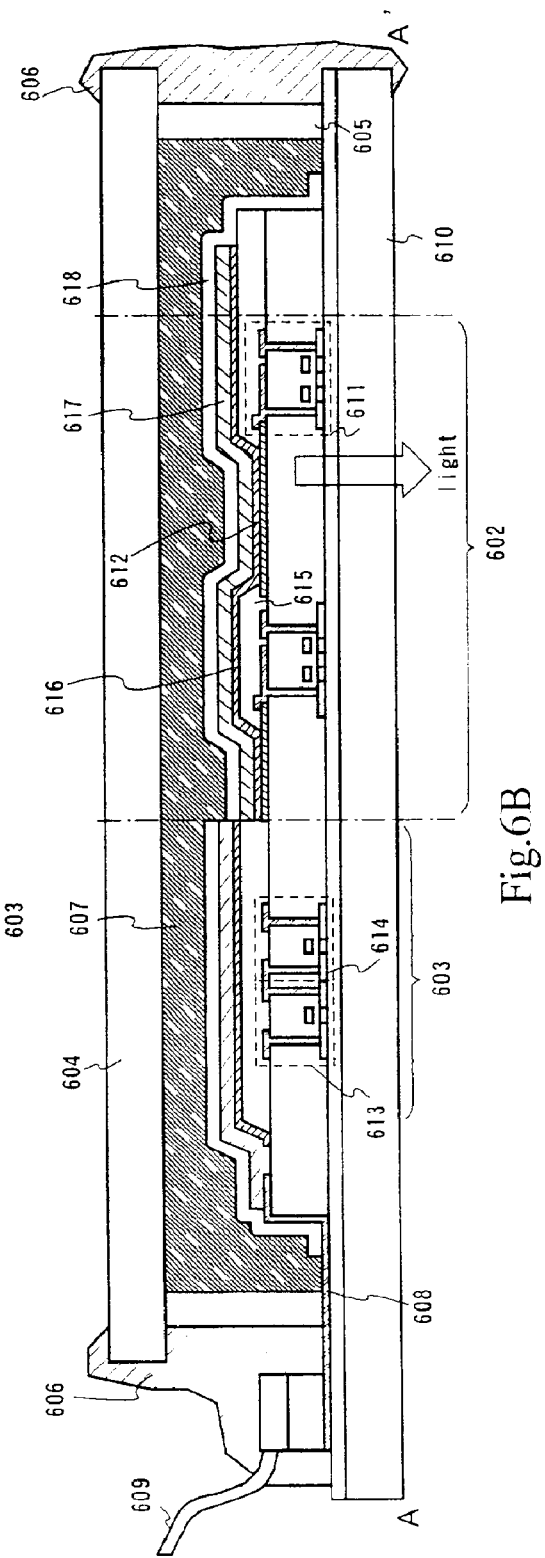
Fig.6A
Fig.6B

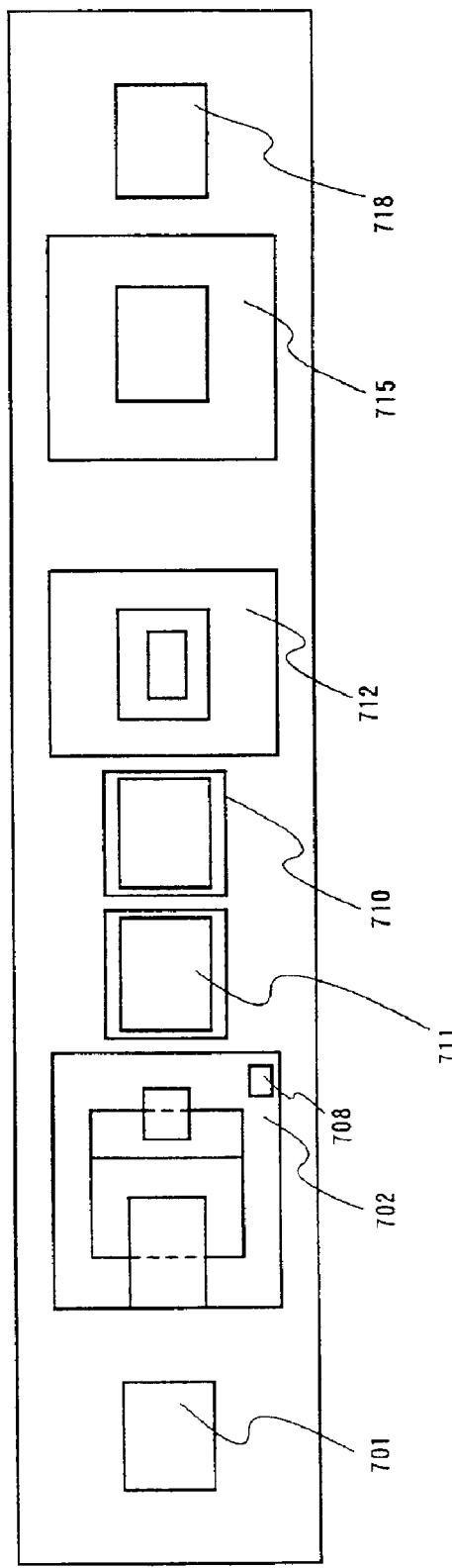
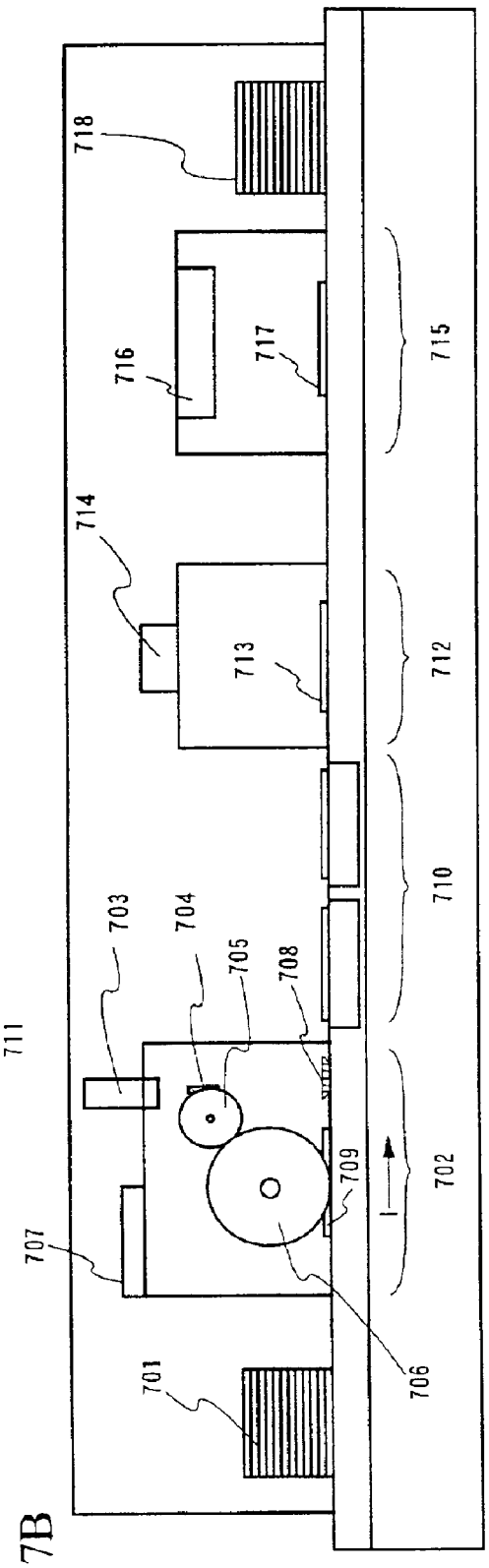
Fig.7A
Fig.7B

Fig.8A
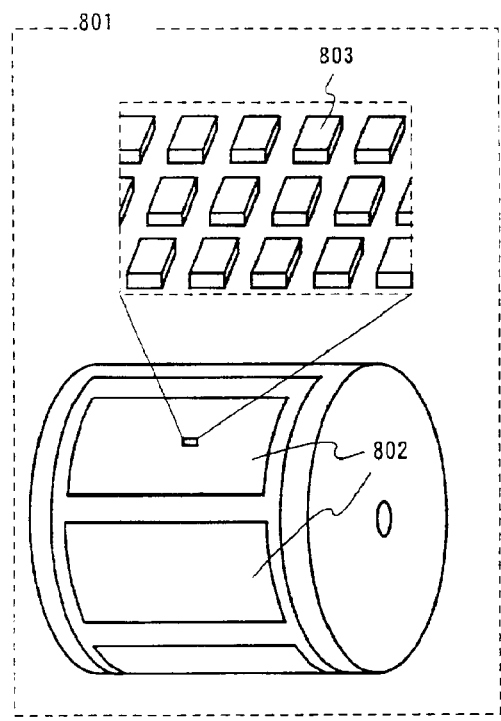
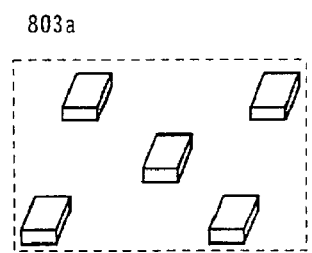
Fig.8B
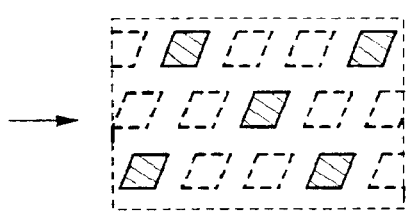
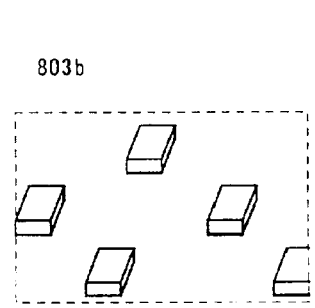
Fig.8C
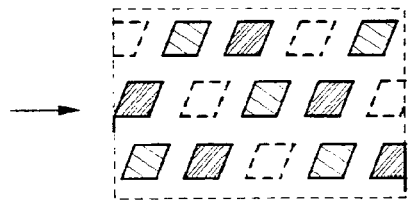
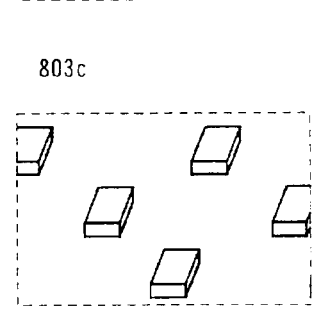
Fig.8D
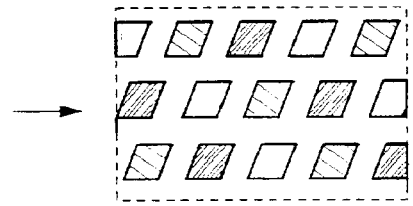

FILM FORMING APPARATUS AND METHOD OF MANUFACTURING LIGHT EMITTING DEVICE

BACKGROUND OF THE INVENTION

1. Field of the Invention

The present invention relates to a film forming apparatus and a film forming method used to manufacture an EL element composed of an anode, a cathode and a light emitting material, especially a self-light emitting material, for providing EL (electro luminescence) (hereinafter referred to as EL material), with the EL material sandwiched between the anode and the cathode. The EL material herein refers to a material that provides fluorescence or phosphorescence when an electric field.

In the present invention, a light emitting device refers to an image display device, or a light emitting device, that uses an EL element. Also, the following modules are all included in the definition of the light emitting device: a module obtained by attaching to an EL element a connector such as an anisotropic conductive film (FPC: flexible printed circuit), a TAB (tape automated bonding) tape, or a TCP (tape carrier package); a module in which a printed wiring board is provided at an end of a TAB tape or a TCP; and a module in which an IC (integrated circuit) is directly mounted with a light emitting element by the COG (chip on glass) method.

2. Description of the Related Art

In recent years, a technique of forming a semiconductor element on a substrate has greatly advanced and application of the semiconductor element to active matrix display devices (light emitting devices) is being developed. The semiconductor element refers to a single element, or a plurality of elements, formed of a semiconductor material and having a switching function. Given as an example of the semiconductor element are transistors, in particular, field effect transistors, typical example of which are a MOS (metal oxide semiconductor) transistor and a thin film transistor (TFT). A TFT formed of a polysilicon film can operate at high speed since the TFT is high in field effect mobility (also called mobility) compared with a conventional TFT that is formed of an amorphous silicon film. This makes it possible to control pixels by a driving circuit formed on the same substrate as the pixels instead of using a driver circuit outside the substrate as in the past.

The active matrix display devices as above have various circuits and elements formed on the same substrate, whereby a diversity of advantages are obtained including reduction in manufacture cost, miniaturization of electro-optical devices, raised yield, and an increase in throughput.

On the other hand, the light emitting device that is being vigorously researched is an active matrix light emitting device which has an EL element as a self-light emitting element (also called an EL display).

In this specification, the EL element of the light emitting device has a structure in which an EL layer is sandwiched between a pair of electrodes (an anode and a cathode). The EL layer generally takes a laminate structure. A typical example of the laminate structure is the one proposed by Tang et al. of Eastman Kodak Company, and consists of a hole transporting layer, a light emitting layer and an electron transporting layer. This structure has so high a light emission efficiency that it is employed in almost all of light emitting devices that are under development at present.

Other examples of the laminate structure include a structure consisting of a hole injection layer, a hole transporting layer, a light emitting layer, and an electron transporting layer which are layered in this order on an anode, and a structure consisting of a hole injection layer, a hole transporting layer, a light emitting layer, an electron transporting layer, and an electron injection layer which are layered in this order on an anode. The light emitting layer may be doped with a fluorescent pigment or the like.

In this specification, all of the layers provided between a cathode and an anode are collectively called an EL layer. Accordingly, the hole injection layer, a hole transporting layer, a light emitting layer, an electron transporting layer, an electron injection layer, etc. mentioned above are all included in the EL layer.

A predetermined voltage is applied to the EL layer with the above structure from the pair of electrodes, whereby recombination of carriers takes place in the light emitting layer to emit light. The EL element in this specification refers to a light emitting element composed of an anode, an EL layer, and a cathode.

The EL layer of the EL element is degraded by heat, light, moisture, oxygen, etc. Therefore, the EL element is generally formed after wirings and TFTs are formed in a pixel portion in manufacturing an active matrix light emitting device.

The EL layer described above can be formed by various methods. Examples of the methods that have been proposed include vacuum evaporation, sputtering, spin coating, roll coating, casting, the LB method, ion plating, dipping, the ink jet method, and printing. The printing is a particularly effective method because the EL layer can be formed selectively.

After the EL element is formed, the substrate over which the EL element is formed (EL panel) is bonded to a covering member by sealing with a sealing member or the like (packaging) without exposing the EL element to the outside air.

After the packaging or other processing for enhancing airtightness, a connector (FPC, TAB, or the like) is attached in order to connect an external signal terminal to a terminal lead out of an element or a circuit formed on the substrate. The active matrix light emitting device is thus completed.

When printing is employed to form the EL layer, a print material changes with time if a solvent for dissolving an EL material is highly volatile. This makes it difficult to process a large number of substrates.

SUMMARY OF THE INVENTION

An object of the present invention is to provide a means for solving the above problem in forming an EL layer by printing.

In order to attain the object above, the present invention is characterized in that an EL layer is formed by printing while setting the pressure in a processing chamber for forming the EL layer by printing (also called a printing chamber) to the atmospheric pressure (normal pressure), or to a pressure higher than the atmospheric pressure, through pressurizing. The processing chamber is connected to a pressure adjusting mechanism. The pressure adjusting mechanism according to the present invention has a function of keeping the pressure in the processing chamber at the atmospheric pressure or near the atmospheric pressure (typically 1 to 2 atm., preferably 1.1 to 1.5 atm.).

Specifically, the mechanism is composed of a compressor for compressing gas to introduce the compressed gas to the processing chamber, and a sensor for measuring the pressure in the processing chamber and then opening or closing an exhaust valve in accordance with the measured pressure. A valve for discharging the gas from the processing chamber is herein called the exhaust valve. The sensor in this specification means a device for measuring the pressure in the processing chamber and inputting a control signal in accordance with the measured value. The control signal from the sensor here is inputted to the exhaust valve to control the opening and closing.

Alternatively, the pressure adjusting mechanism may have a heater that heats the processing chamber to pressurize the processing chamber and set the pressure in the processing chamber to a desired pressure. In this case, the signal from the sensor is inputted to a variable resister for controlling electric power to be given to the heater from a power source.

The present invention is also characterized in that the processing chamber is filled with inert gas or set to a solvent atmosphere to form the EL layer.

The inert gas is gas with poor reactivity, specifically, noble gas such as argon and helium, or nitrogen. The solvent atmosphere refers to a state in which a space or a processing chamber is filled with a solvent in the gaseous state.

The present invention is also characterized by providing a film forming apparatus equipped with, in addition to the processing chamber for forming the EL layer (the printing chamber), a processing chamber for drying the EL layer formed by printing (a drying chamber), a processing chamber for forming a cathode or an anode of the EL element (an evaporation chamber), and a processing chamber for sealing the completed EL element (a sealing chamber) so that all the processing can be handled by a single apparatus.

Printing in this specification refers to a method of forming an EL layer on an electrode adopting a printing method such as letterpress, plate printing, or screen printing (silkscreen). Letterpress is particularly preferable to form an EL layer. Now, a description is given with reference to FIGS. 1A to 1C on printing according to the present invention, which adopts letterpress (a letterpress printing method).

FIG. 1A shows a processing chamber for forming an EL layer by the letterpress printing method in accordance with the present invention. In this specification, the processing chamber provided with a printing device for forming an EL layer by printing is called a printing chamber. The processing chamber in FIG. 1A is denoted by 118.

In FIGS. 1A to 1C, reference symbol 110 denotes an anilox roll and 111 denotes a doctor bar (also called a doctor blade). With the doctor bar 111, a mixture of an EL material and a solvent (hereinafter the mixture is referred to as EL forming material 112) pools about the surface of the anilox roll 110. The EL material here refers to a fluorescent organic compound, namely, an organic compound generally called as a hole injection layer, a hole transporting layer, a light emitting layer, an electron transporting layer, or an electron injection layer.

On the surface of the anilox roll 110, mesh-like grooves (hereinafter referred to as mesh) 110a is provided as shown in FIG. 1B. The mesh 110a holds the EL forming material 112 to the surface of the anilox roll through rotation of the anilox roll in the direction indicated by the arrow A. The dotted line over the surface of the anilox roll 110 in FIG. 1A represents the EL forming material held to the surface of the anilox roll 110.

Reference symbol 113 denotes a printing roll and 114 denotes a letterpress plate. The letterpress plate 114 has uneven surface obtained by etching or the like. The uneven surface is shown in FIG. 1C. In FIG. 1C, pixel portion patterns 114a are formed in different places on the letterpress plate 114 in order to manufacture plural sheets of light emitting devices on a single substrate. Looking at the enlarged view of the pixel portion patterns 114a, each pattern has convex 114b at positions corresponding to positions of a plurality of pixels.

The anilox roll 110 rotates to keep holding the EL forming material 112 in the mesh 110a. On the other hand, the printing roll 113 rotates in the direction indicated by the arrow B and only the convex 114b on the letterpress plate 114 come into contact with the mesh 110a. Upon contact, the EL forming material 112 is applied to surfaces of the convex 114b.

The EL forming material 112 is printed at positions where the convex 114b is brought into contact with a substrate 115 that moves horizontally (in the direction indicated by the arrow C) at the same speed as the printing roll 113. Thus the EL forming material 112 is printed forming a matrix on the substrate 115.

Thereafter, the solvent contained in the EL forming material 112 is vaporized to leave the EL material through heat treatment in a nitrogen atmosphere at the atmospheric pressure in another processing chamber (called a drying chamber in this specification). Accordingly, the solvent needs to be vaporized at a temperature lower than the glass transition temperature (Tg) of the EL material. The viscosity of the EL forming material 112 determines the final thickness of the EL layer to be formed. The viscosity can be adjusted by choosing a solvent. A preferable viscosity is $1 \times 10^{-3}$ to $5 \times 10^{-2}$ Pa s (more desirably $1 \times 10^{-3}$ to $2 \times 10^{-2}$ Pa·s).

Typical examples of the solvent for dissolving the EL material include toluene, xylene, chlorobenzen, dichlorobenzen, anisole, chloroform, dichloromethane, γbutyl lactone, butyl Cellosolve, cyclohexane, NMP (N-methyl-2-pyrrolidone), cyclohexanone, dioxane, and THF (tetrahydrofuran).

If the EL forming material 112 contains too many impurities that could serve as crystal nuclei, the possibility that the EL material is crystallized is high in vaporizing the solvent. The EL material crystallized is low in light emission efficiency and hence is undesirable. Therefore, less impurity in the EL forming material 112 is better.

In order to reduce the impurities, the environment has to be cleaned as much as possible in refining the solvent, refining the EL material, and mixing the solvent with the EL material. An equally important matter in the present invention is that the atmosphere in the printing device in printing the EL forming material is conditioned so as to reduce the impurities.

To condition the atmosphere, a chamber in which the printing device is installed (typically a clean booth) is filled with inert gas such as nitrogen, helium or argon in printing the EL forming material. Alternatively, the chamber is set to a solvent atmosphere containing the solvent used to dissolve the EL material.

When the printing chamber 118 is to be set to a solvent atmosphere, the solvent is put in a solvent tray 117 that is provided in the printing chamber 118.

According to the present invention, a pressure adjusting mechanism 116 provided in the printing chamber 118 keeps the pressure in the printing chamber 118 filled with inert gas or set to a solvent atmosphere at the atmospheric pressure or near the atmospheric pressure (typically 1 to 2 atm., preferably 1.1 to 1.5 atm.).

With carrying out the present invention, no apparatus such as a vacuum evaporation, which needs vacuum exhaust equipment device, is required form the EL material into a film. Therefore the overall system is simplified and maintenance is easy, making the present invention advantageous.

The present invention can be embodied in passive matrix (simple matrix) light emitting devices as well as active matrix light emitting devices.

BRIEF DESCRIPTION OF THE DRAWINGS

In the accompanying drawings:

FIGS. 3A to 3C are diagrams showing a process of manufacturing an active matrix light emitting device;

FIGS. 4A to 4C are diagrams showing the process of manufacturing the active matrix light emitting device;

FIGS. 6A and 6B are diagrams showing a structure for sealing a light emitting device;

FIGS. 7A and 7B are diagrams showing an in-line film forming apparatus;

FIGS. 8A to 8D are diagrams illustrating multi-color printing;

DETAILED DESCRIPTION OF THE PREFERRED EMBODIMENTS

[Embodiment Mode]

Now, an apparatus for performing the present invention will be described with reference to FIG. 2. The apparatus performs a series of processing from forming an EL layer by printing to forming an electrode followed by sealing an EL element. Shown in FIG. 2 is a top view of a multi-chamber film forming apparatus.

Figure 2:
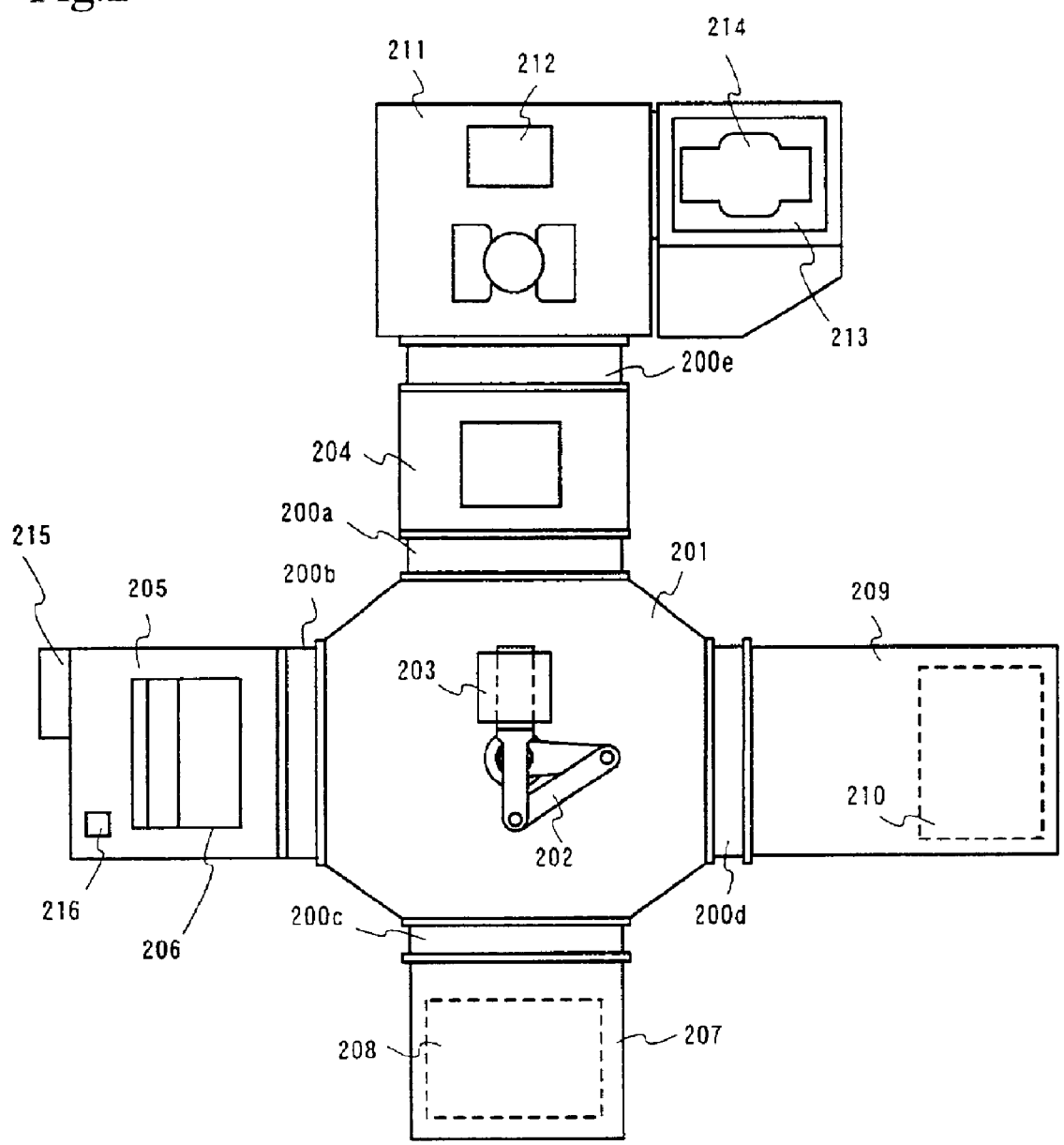
FIG. 2 is a diagram showing a multi-chamber film forming apparatus.

In FIG. 2, reference symbol 201 denotes a transfer chamber. The transfer chamber 201 is provided with a transfer mechanism (A) 202 to transfer substrates 203. The transfer chamber 201 is set to a reduced pressure atmosphere and is connected to respective processing chambers through gates. The transfer mechanism (A) 202 hands the substrates to the respective processing chambers while the gates are opened. The pressure in the transfer chamber 201 can be reduced by a vacuum pump such as an oil rotary pump, a mechanical booster pump, a turbomolecular pump, or a cryopump. Preferably, a cryopump is used for its effectiveness in removing moisture.

The processing chambers will be described below respectively. Of the processing chambers, those directly connected to the transfer chamber 201 have vacuum pumps (not shown) since the transfer chamber 201 is set to an atmospheric atmosphere. Examples of the vacuum pumps are given as above and include an oil rotary pump, a mechanical booster pump, a turbomolecular pump, and a cryopump.

First, denoted by 204 is a loading chamber in which the substrates are set and which doubles as an unloading chamber. The loading chamber 204 is connected to the transfer chamber 201 through a gate 200a, and a carrier (not shown) with the substrates 203 set is placed in the loading chamber 204. The loading chamber 204 may be divided into two rooms, one for bringing the substrates in and the other for sending the substrates out. The loading chamber 204 is provided with, as well as the vacuum pump mentioned above, a purge line for introducing nitrogen gas or noble gas.

Next, reference symbol 205 denotes a printing chamber for forming an EL material into a film by printing. The printing chamber 205 is connected to the transfer chamber 201 through a gate 200b. The printing chamber 205 has therein a printing unit 206 where a hole injection layer, a light emitting layer that emits red light, a light emitting layer that emits green light, and a light emitting layer that emits blue light are formed. Any material can be used for the hole injection layer, the light emitting layer that emits red light, the light emitting layer that emits green light, and the light emitting layer that emits blue light.

The EL layer is formed by printing in the present invention, and therefore an appropriate EL material is a polymer material. Typical polymer materials are high molecular materials such as a polyparaphenylene vinylyene (PPV) based material, a polyvinyl carbazole (PVK) based material, and a polyfluoren (PF) based material.

In order to form a hole injection layer, a hole transporting layer, and a light emitting layer from polymer materials by printing, a polymer precursor is printed and then heated to transfer the precursor into a polymer material as an EL material. Other necessary EL materials are formed into films by evaporation or the like and the formed films are laminated thereon, thus obtaining the EL layer with a laminate structure.

Specifically, a hole transporting layer is formed by heating polytetrahydrothiophenylphenylene as a polymer precursor to transform it into polyphenylene vinylene. An appropriate thickness for the hole transporting layer is 30 to 100 nm (preferably 40 to 80 nm). Preferable materials of light emitting layers are: cyanopolyphenylen vinylene for a red light emitting layer, polyphenylene vinylene for a green light emitting layer, and polyphenylene vinylene or polyalkyl phenylene for a blue light emitting layer. An appropriate thickness for each light emitting layer is 30 to 150 nm (preferably 40 to 100 nm).

It is also effective to form as a buffer layer a copper phthalocyanine film between an electrode and the EL material film formed thereon.

The materials given above are merely examples of materials that can be used for the EL material of the present invention, and there is no need to limit the above EL material. According to the present invention, the EL material is mixed with a solvent to print the mixture and then the solvent is removed by vaporization to form the EL layer. Therefore any EL material can be used as long as the combination of the EL material and the solvent does not cause the temperature for vaporizing the solvent to exceed the glass transition temperature of the EL layer.

It is also effective to add thereto an additive in order to increase the viscosity of the EL forming material. The EL material can be a low molecular material if it is soluble in a solvent.

When the EL layer is formed by printing, the EL layer could easily be degraded under the presence of moisture and oxygen. Therefore these factors for degrading have to be removed as much as possible before formation. To eliminate moisture and oxygen, a printing device is desirably installed in a chamber (the printing chamber here) filled with inert gas such as argon or helium to print in an inert atmosphere.

The dew point of the inert gas used is desirably −20° C. or lower, more desirably −50° C. or lower.

In order to form the EL forming material into a uniform film, it is effective to set the printing chamber to a solvent atmosphere containing a solvent that constitutes the EL forming material. The solvent atmosphere can be obtained by putting the solvent in a solvent tray 216.

The pressure in the chamber filled with inert gas or set to a solvent atmosphere is kept at the atmospheric pressure or the chamber is kept pressurized (to reach 1 to 2 atm. typically, 1.1 to 1.5 atm. preferably). The pressure is adjusted by a pressure adjusting mechanism 215. In carrying out the present invention, no apparatus such as a vacuum evaporation device, which needs vacuum exhaust equipment, is required to form the EL material into a film. Therefore the overall system is simplified and maintenance is easy, making the present invention advantageous.

The EL material formed into a film in the printing chamber 205 is then dried in a drying chamber 207. The drying chamber 207 is connected to the transfer chamber 201 through a gate 200c. The EL material on the substrate may be dried here by placing the substrate on a hot plate unit 208 that is provided in the drying chamber 207.

The next processing chamber denoted by 209 is an evaporation chamber for forming a conductive film that is to serve as an anode or a cathode of an EL element by evaporation. The evaporation chamber 209 is connected to the transfer chamber 201 through a gate 200d.

The evaporation chamber 209 has therein a film forming unit 210. A specific example of the conductive film formed in the film forming unit 210 is an MgAg film or an Al—Li alloy film (an alloy film of aluminum and lithium), which serves as the cathode of the EL element.

Alternatively, aluminum may be subjected to co-evaporation with an element which belongs to Group 1 or Group 2 in the periodic table. Co-evaporation is an evaporation method in which plural evaporation cells are simultaneously heated to mix different substances during film formation.

Next, denoted by 211 is a sealing chamber (also called an enclosing chamber or a glove box), which is connected to the loading chamber 204 through a gate 200e. The sealing chamber 211 conducts the final processing of enclosing the EL element in an airtight space. The processing is carried out for protecting the completed EL element from oxygen and moisture. Through the processing, the EL element is automatically enclosed using a sealing member, or is enclosed using either a thermally curable resin or a UV-curable resin.

The sealing member may be glass, ceramics, plastics, or metals. If the light is emitted toward the sealing member side, the sealing member has to be transmissive to light. The sealing member is bonded to the substrate on which the EL element is formed using a thermally curable resin or a UV-curable resin. The resin is then cured by heat treatment or ultraviolet ray irradiation treatment to create an airtight space. It is also effective to put in the airtight space a hygroscopic material, typical example of which is barium oxide.

The space defined by the sealing member and the substrate on which the EL element is formed may be filled with a thermally curable resin or a UV-curable resin. In this case, adding a hygroscopic material, typical example of which is barium oxide, to the thermally curable resin or the UV-curable resin is effective.

In the film forming apparatus shown in FIG. 2, a mechanism for irradiating ultraviolet rays (hereinafter referred to as ultraviolet ray irradiation mechanism) 212 is provided in the sealing chamber 211. The ultraviolet ray irradiation mechanism 212 emits ultraviolet rays to cure the UV-curable resin. The inside of the sealing chamber 211 may be set to reduced pressure if a vacuum pump is installed in the sealing chamber 211. When the above enclosing step is automatically conducted through operation of a robot, the reduced pressure prevents oxygen and moisture from entering. On the other hand, the inside of the sealing chamber 211 may be pressurized. In this case, pressurization is carried out while purging with nitrogen gas or noble gas with high purity to prevent oxygen or other contaminants from entering from the outside air.

The sealing chamber 211 is connected to a handing-over chamber (pass box) 213. The handing-over chamber 213 is provided with a transfer mechanism (B) 214, which transfers the substrate whose EL element has been enclosed in the sealing chamber 211 to the handing-over chamber 213. The handing-over chamber 213 may also be set to reduced pressure if a vacuum pump is provided therein. The handing-over chamber 213 is installed to avoid direct exposure of the sealing chamber 211 to the outside air, and the substrate is taken out of the handing-over chamber.

With the film forming apparatus described above, a series of processing up through enclosing the EL element into an airtight space can be achieved without exposure to the outside air. The apparatus thus can manufacture a light emitting device with high reliability. The film forming apparatus shown here is merely one mode of carrying out the present invention and does not limit the present invention.

[Embodiment 1]

Here, a method of simultaneously forming, on the same substrate, a pixel portion and TFTs (n-channel TFT and p-channel TFT) of a driver circuit provided in the periphery of the pixel portion, is described in detail with FIGS. 3A to 5B.

First, in this embodiment, a substrate 300 is used, which is made of glass such as barium borosilicate glass or aluminum borosilicate, represented by such as Corning #7059 glass and #1737 glass. Note that, as the substrate 300, there is no limitation provided that it is a substrate with transmittance, and a quartz substrate may be used. A plastic substrate with heat resistance to a process temperature of this embodiment may also be used.

Then, a base film 301 formed of an insulating film such as a silicon oxide film, a silicon nitride film or a silicon nitride oxide film is formed on the substrate 300. In this embodiment, a two-layer structure is used as the base film 301. However, a single-layer film or a lamination structure consisting of two or more layers of the insulating film may be used. As a first layer of the base film 301, a silicon nitride oxide film 301a is formed with a thickness of 10 to 200 nm (preferably 50 to 100 nm) with a plasma CVD method using $SiH_4$, $NH_3$, and $N_2O$ as reaction gas. In this embodiment, the silicon nitride oxide film 301a (composition ratio Si=32%, O=27%, N=24% and H=17%) with a film thickness of 50 nm is formed. Then, as a second layer of the base film 301, a silicon nitride oxide film 301b is formed and laminated into a thickness of 50 to 200 nm (preferably 100 to 150 nm) with a plasma CVD method using $SiH_4$ and $N_2O$ as reaction gas. In this embodiment, the silicon nitride oxide film 301b (composition ratio Si=32%, O=59%, N=7% and H=2%) with a film thickness of 100 nm is formed.

Subsequently, semiconductor layers 302 to 305 are formed on the base film. The semiconductor layers 302 to 305 are formed from a semiconductor film with an amorphous structure which is formed by a known method (such as a sputtering method, an LPCVD method, or a plasma CVD method), and is subjected to a known crystallization process (a laser crystallization method, a thermal crystallization method, or a thermal crystallization method using a catalyst such as nickel). The crystalline semiconductor film thus obtained is patterned into desired shapes to obtain the semiconductor layers. The semiconductor layers 302 to 305 are formed into the thickness of from 25 to 80 nm (preferably 30 to 60 nm). The material of the crystalline semiconductor film is not particularly limited, but it is preferable to be formed of silicon, a silicon germanium ($Si_xGe_{1-x}$(X=0.0001 to 0.02)) alloy, or the like. In this embodiment, 55 nm thick amorphous silicon film is formed by a plasma CVD method, and then, a nickel-containing solution is held on the amorphous silicon film. A dehydrogenation process of the amorphous silicon film is performed (500° C. for one hour), and thereafter a thermal crystallization process is performed (550° C. for four hours) thereto. Further, to improve the crystallinity thereof, a laser annealing treatment is performed to form the crystalline silicon film. Then, this crystalline silicon film is subjected to a patterning process using a photolithography method, to obtain the semiconductor layers 302 to 305.

Further, after the formation of the semiconductor layers 302 to 305, a minute amount of impurity element (boron or phosphorus) may be doped to control a threshold value of the Besides, in the case where the crystalline semiconductor film is manufactured by the laser crystallization method, a pulse-oscillation type or continuous-wave type excimer laser, YAG laser, or $YVO_4$ laser may be used. In the case where those kinds of laser are used, it is appropriate to use a method in which laser light radiated from a laser oscillator is condensed by an optical system into a linear beam, and is irradiated to the semiconductor film. Although the conditions of the crystallization should be properly selected by an operator, in the case where the excimer laser is used, a pulse oscillation frequency is set as 300 Hz, and a laser energy density is set as 100 to 400 $mJ/cm^2$ (typically 200 to 300 $mJ/cm^2$). In the case where the YAG laser is used, it is appropriate that the second harmonic is used to with a pulse oscillation frequency of 30 to 300 Hz and a laser energy density of 300 to 600 $mJ/cm^2$ (typically, 350 to 500 $mJ/cm^2$). Then, laser light condensed into a linear shape with a width of 100 to 1000 $\mu$m, for example, 400 $\mu$m is irradiated to the whole surface of the substrate, and an overlapping ratio (overlap ratio) of the linear laser light at this time may be set as 50 to 90%.

A gate insulating film 306 is then formed for covering the semiconductor layers 302 to 305. The gate insulating film 106 is formed of an insulating film containing silicon by a plasma CVD method or a sputtering method into a film thickness of from 40 to 150 nm. In this embodiment, the gate insulating film 306 is formed of a silicon nitride oxide film into a thickness of 110 nm by a plasma CVD method (composition ratio Si=32%, O=59%, N=7%, and H=2%). Of course, the gate insulating film is not limited to the silicon nitride oxide film, and an other insulating film containing silicon may be used as a single layer or a lamination structure.

Besides, when the silicon oxide film is used, it can be possible to be formed by a plasma CVD method in which TEOS (tetraethyl orthosilicate) and $O_2$ are mixed and discharged at a high frequency (13.56 MHZ) power density of 0.5 to 0.8 $W/cm^2$ with a reaction pressure of 40 Pa and a substrate temperature of 300 to 400° C. Good characteristics as the gate insulating film can be obtained in the manufactured silicon oxide film thus by subsequent thermal annealing at 400 to 500° C.

Then, as shown in FIG. 3A, on the gate insulating film 306, a first conductive film 307 with a thickness of 20 to 100 nm and a second conductive film 308 with a thickness of 100 to 400 nm are formed and laminated. In this embodiment, the first conductive film 307 of TaN film with a film thickness of 30 nm and the second conductive film 308 of a W film with a film thickness of 370 nm are formed into lamination. The TaN film is formed by sputtering with a Ta target under a nitrogen containing atmosphere. Besides, the W film is formed by the sputtering method with a W target. The W film may be formed by a thermal CVD method using tungsten hexafluoride ($WF_6$). Whichever method is used, it is necessary to make the material have low resistance for use as the gate electrode, and it is preferred that the resistivity of the W film is set to less than or equal to 20 $\mu\Omega$cm. By making the crystal grains large, it is possible to make the W film have lower resistivity. However, in the case where many impurity elements such as oxygen are contained within the W film, crystallization is inhibited and the resistance becomes higher. Therefore, in this embodiment, by forming the W film by a sputtering method using a W target with a purity of 99.9999%, and in addition, by taking sufficient consideration to prevent impurities within the gas phase from mixing therein during the film formation, a resistivity of from 9 to 20 $\mu\Omega$cm can be realized.

Note that, in this embodiment, the first conductive film 307 is made of TaN, and the second conductive film 308 is made of W, but the material is not particularly limited thereto, and either film may be formed of an element selected from the group consisting of Ta, W, Ti, Mo, Al, Cu, Cr, and Nd, or an alloy material or a compound material containing the above element as its main constituent. Besides, a semiconductor film, typified by a polycrystalline silicon film doped with an impurity element such as phosphorus, may be used. Further, an AgPdCu alloy may be used. Besides, any combination may be employed such as a combination in which the first conductive film is formed of tantalum (Ta) and the second conductive film is formed of W, a combination in which the first conductive film is formed of titanium nitride (TiN) and the second conductive film is formed of W, a combination in which the first conductive film is formed of tantalum nitride (TaN) and the second conductive film is formed of Al, or a combination in which the first conductive film is formed of tantalum nitride (TaN) and the second conductive film is formed of Cu.

Next, masks 309 to 313 made of resist are formed using a photolithography method, and a first etching process is performed in order to form electrodes and wirings. This first etching process is performed with the first and second etching conditions. In This embodiment, as the first etching conditions, an ICP (inductively coupled plasma) etching method is used, a gas mixture of $CF_4$, $Cl_2$ and $O_2$ is used as an etching gas, the gas flow rate is set to 25/25/10 sccm, and plasma is generated by applying a 500 W RF (13.56 MHZ) power to a coil shape electrode under 1 Pa. A dry etching device with ICP (Model E645-ICP) produced by Matsushita Electric Industrial Co. Ltd. is used here. A 150 W RF (13.56 MHZ) power is also applied to the substrate side (test piece stage) to effectively apply a negative self-bias voltage. The W film is etched with the first etching conditions, and the end portion of the second conductive layer is formed into a tapered shape. In the first etching conditions, the etching rate for W is 200.39 nm/min, the etching rate for TaN is 80.32 nm/min, and the selectivity of W to TaN is about 2.5. Further, the taper angle of W is about 26° with the first etching conditions.

Thereafter, the first etching conditions are changed into the second etching conditions without removing the masks 309 to 312 made of resist, a mixed gas of $CF_4$ and $Cl_2$ is used as an etching gas, the gas flow rate is set to 30/30 sccm, and plasma is generated by applying a 500 W RF (13.56 MHZ) power to a coil shape electrode under 1 Pa to thereby perform etching for about 30 seconds. A 20 W RF (13.56 MHZ) power is also applied to the substrate side (test piece stage) to effectively a negative self-bias voltage. The W film and the TaN film are both etched on the same order with the second etching conditions in which $CF_4$ and $Cl_2$ are mixed. In the second etching conditions, the etching rate for W is 58.97 nm/min, and the etching rate for TaN is 66.43 nm/min. Note that, the etching time may be increased by approximately 10 to 20% in order to perform etching without any residue on the gate insulating film.

In the first etching process, the end portions of the first and second conductive layers are formed to have a tapered shape due to the effect of the bias voltage applied to the substrate side by adopting masks of resist with a suitable shape. The angle of the tapered portions may be set to 15° to 45°. Thus, first shape conductive layers 314 to 318 (first conductive layers 314a to 318a and second conductive layers 314b to 318b) constituted of the first conductive layers and the second conductive layers are formed by the first etching process. The width of the first conductive layers in a channel length direction corresponds to W1 shown in the embodiment mode. Reference numeral 319 denotes a gate insulating film, and regions of the gate insulating film which are not covered by the first shape conductive layers 314 to 318 are made thinner by approximately 20 to 50 nm by etching.

Then, a first doping process is performed to add an impurity element for imparting an n-type conductivity to the semiconductor layer without removing the mask made of resist (FIG. 3B). Doping may be carried out by an ion doping method or an ion injecting method. The condition of the ion doping method is that a dosage is $1 \times 10^{13}$ to $5 \times 10^{15}$ atoms/$cm^2$, and an acceleration voltage is 60 to 100 keV. In this embodiment, the dosage is $1.5 \times 10^{15}$ atoms/$cm^2$ and the acceleration voltage is 80 keV. As the impurity element for imparting the n-type conductivity, an element which belongs to group 15 of the periodic table, typically phosphorus (P) or arsenic (As) is used, and phosphorus is used here. In this case, the conductive layers 314 to 318 become masks to the impurity element for imparting the n-type conductivity, and high concentration impurity regions 320 to 323 are formed in a self-aligning manner. The impurity element for imparting the n-type conductivity is added to the high concentration impurity regions 320 to 323 in the concentration range of $1 \times 10^{20}$ to $1 \times 10^{21}$ atoms/$cm^3$.

Thereafter, the second etching process is performed without removing the masks made of resist as shown in FIG. 3C. Here, a mixed gas of $CF_4$, $Cl_2$ and $O_2$ is used as an etching gas, the gas flow rate is set to 25/25/10 sccm, and plasma is generated by applying a 500 W RF (13.56 MHZ) power to a coil shape electrode under 1 Pa to thereby perform etching. A 20 W RF (13.56 MHZ) power is also applied to the substrate side (test piece stage) to effectively apply a negative self-bias voltage. In the second etching process, the etching rate for W is 124.62 nm/min, the etching rate for TaN is 20.67 nm/min, and the selectivity of W to TaN is 6.05. Accordingly, the W film is selectively etched. The taper angle of W is 70° in the second etching. Second conductive layers 324b to 327b are formed by the second etching process. On the other hand, the first conductive layers 314a to 318a are hardly etched, and first conductive layers 324a to 327a are formed.

Next, a second doping process is performed. Second conductive layers 122b to 125b are used as masks to an impurity element, and doping is performed such that the impurity element is added to the semiconductor layer below the tapered portions of the first conductive layers. In this embodiment, phosphorus (P) is used as the impurity element, and plasma doping is performed with the dosage of $3.5 \times 10^{12}$ atoms/$cm^2$ and the acceleration voltage of 90 keV. Thus, low concentration impurity regions 329 to 332, which overlap with the first conductive layers, are formed in a self-aligning manner. The concentration of phosphorus (P) in the low concentration impurity regions 329 to 332 is $1 \times 10^{17}$ to $1 \times 10^{18}$ atoms/$cm^3$, and has a gentle concentration gradient in accordance with the film thickness of the tapered portions of the first conductive layers. Note that, in the semiconductor layer that overlaps with the tapered portions of the first conductive layers, the concentration of the impurity element slightly falls from the end portions of the tapered portions of the first conductive layers toward the inner portions. The concentration, however, keeps almost the same level. Further, the impurity element is added to the high concentration impurity regions 333 to 336 to form high concentration impurity regions 333 to 336.

Thereafter, a third etching process is performed without removing the masks made of resist as shown in FIG. 4A. The tapered portions of the first conductive layers are partially etched to thereby reduce the regions that overlap with the semiconductor layer in the third etching process. Here, $CHF_3$ is used as an etching gas, and a reactive ion etching method (RIE method) is used. In this embodiment, the third etching process is performed with the chamber pressure of 6.7 Pa, the RF power of 800 W, the $CHF_3$ gas flow rate of 35 sccm. Thus, first conductive layers 341 to 344 are formed.

In the third etching process, the insulating film 319 is etched at the same time, a part of the high concentration impurity regions 333 to 336 is exposed, and insulating films 346a to 346d are formed. Note that, in this embodiment, the etching condition by which the part of the high concentration impurity regions 333 to 336 is exposed is used, but it is possible that a thin layer of the insulating film is left on the high concentration impurity regions if the thickness of the insulating film or the etching condition is changed.

In accordance with the third etching process, impurity regions (LDD regions) 337a to 340a are formed, which do not overlap with the first conductive layers 341 to 344. Note that, impurity regions (GOLD regions) 337b to 340b remain overlapped with the first conductive layers 341 to 344.

The electrode formed of the first conductive layer 341 and the second conductive layer 324b becomes a gate electrode of an n-channel TFT of a driver circuit to be formed in the later process. The electrode formed of the first conductive layer 342 and the second conductive layer 325b becomes a gate electrode of a p-channel TFT of the driver circuit to be formed in the later process. Similarly, the electrode formed of the first conductive layer 343 and the second conductive layer 326b becomes a gate electrode of an n-channel TFT of a pixel portion to be formed in the later process, and the electrode formed of the first conductive layer 344 and the second conductive layer 327b becomes one of electrodes of a storage capacitor of the pixel portion to be formed in the later process.

In accordance with the above processes, in this embodiment, the difference between the impurity concentration in the impurity regions (GOLD regions) 337b to 340b that overlap with the first conductive layers 341 to 344 and the impurity concentration in the impurity regions (LDD regions) 337a to 340a that do not overlap with the first conductive layers 341 to 344 can be made small, thereby improving the TFT characteristics.

Next, the masks of resist are removed, masks 348 and 349 are newly formed of resist, and a third doping process is performed. In accordance with the third doping process, impurity regions 350 to 355 are formed, in which the impurity element imparting a conductivity (p-type) opposite to the above conductivity (n-type) is added to the semiconductor layer that becomes an active layer of the p-channel TFT (FIG. 4B). The first conductive layers 342 and 344 are used as masks to the impurity element, and the impurity element that imparts the p-type conductivity is added to thereby form impurity regions in a self-aligning manner. In this embodiment, the impurity regions 350 to 355 are formed by an ion doping method using diborane ($B_2H_6$). Note that, in the third doping process, the semiconductor layer to become the n-channel TFT is covered with the masks 145 and 146 formed of resist. Although phosphorus is added to the impurity regions 348 and 349 to become the p-channel TFT of the source region and the drain region at different concentrations in accordance with the first and second doping processes, the doping process is performed such that the concentration of the impurity element imparting p-type conductivity is in the range of $2\times10^{20}$ to $2\times10^{21}$ atoms/cm$^3$ in any of the impurity regions. Thus, the impurity regions function as a source region and a drain region of the p-channel TFT with no problem. In this embodiment, a part of the semiconductor that becomes an active layer of the p-channel TFT is exposed, and thus, there is an advantage that an impurity element (boron) is easily added.

In accordance with the above-described processes, the impurity regions are formed in the respective semiconductor layers.

Subsequently, the masks 348 and 349 of resist are removed, and a first interlayer insulating film 356 is formed. This first interlayer insulating film 356 is formed of an insulating film containing silicon by a plasma CVD method or a sputtering method into a thickness of 100 to 200 nm. In this embodiment, a silicon nitride oxide film with a film thickness of 150 nm is formed by a plasma CVD method. Of course, the first interlayer insulating film 356 is not particularly limited to the silicon nitride oxide film, but an other insulating film containing silicon may be formed into a single layer or a lamination structure.

Then, as shown in FIG. 8C, a step of activating the impurity elements added in the respective semiconductor layers is performed. This step is carried out by thermal annealing using a furnace annealing oven. The thermal annealing may be performed in a nitrogen atmosphere containing an oxygen content of 1 ppm or less, preferably 0.1 ppm or less, at 400 to 700° C., typically 500 to 550° C. In this embodiment, a heat treatment at 550° C. for 4 hours is carried out. Note that, except the thermal annealing method, a laser annealing method, or a rapid thermal annealing method (RTA method) can be applied thereto.

Note that, in this embodiment, at the same time as the above activation process, nickel used as the catalyst in crystallization is gettered to the impurity regions (333, 335, 350, 353) containing phosphorous at a high concentration. As a result, nickel concentration of the semiconductor layer which becomes a channel forming region is mainly lowered. The TFT with a channel forming region thus formed has an off current value decreased, and has high electric field mobility because of good crystallinity, thereby attaining satisfactory characteristics.

Further, an activation process may be performed before forming the first interlayer insulating film. However, in the case where a wiring material used is weak to heat, it is preferable that the activation process is performed after an interlayer insulating film (an insulating film containing silicon as its main ingredient, for example, silicon nitride oxide film) is formed to protect the wiring or the like as in this embodiment.

In addition, heat treatment at 300 to 550° C. for 1 to 12 hours is performed in an atmosphere containing hydrogen of 3 to 100%, to perform a step of hydrogenating the semiconductor layers. In this embodiment, the heat treatment is performed at 410° C. for 1 hour in an atmosphere containing hydrogen of about 3 %. This step is a step of terminating dangling bonds in the semiconductor layer with hydrogen in the interlayer insulating film. As another means for hydrogenation, plasma hydrogenation (using hydrogen excited by plasma) may be carried out.

Besides, in the case of using a laser annealing method as the activation process, it is preferred to irradiate laser light such as an excimer laser or a YAG laser after the hydrogenating process.

Figure 5A:
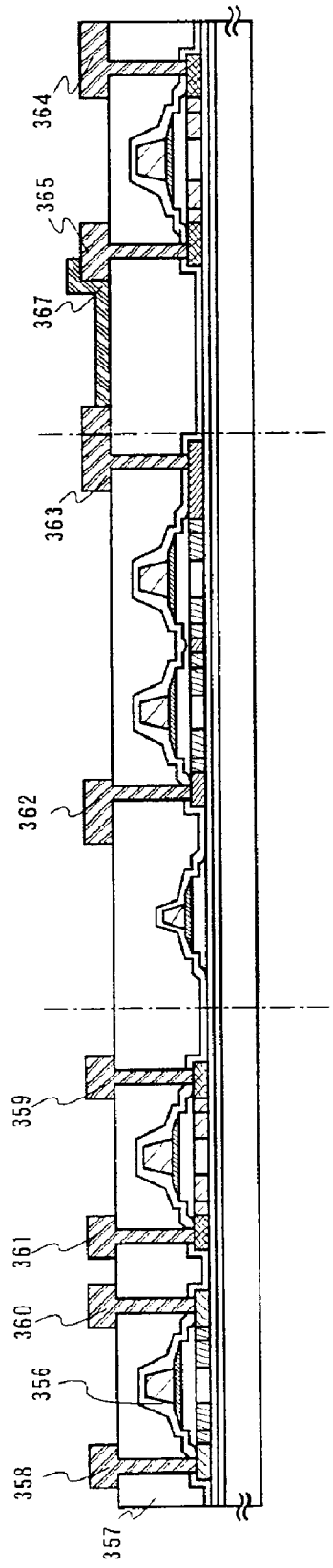
FIGS. 5A and 5B are diagrams showing the process of manufacturing the active matrix light emitting device.

Next, as shown in FIG. 5A, a second interlayer insulating film 357 is formed on the first interlayer insulating film 356 from an organic insulating material. In this embodiment, an acrylic resin film with a thickness of 1.6 $\mu$m is formed. Patterning is then performed to form contact holes respectively reaching the impurity regions 333, 335, 350, and 353.

A film of an insulating material containing silicon or of a film of an organic resin can be used as the second interlayer insulating film 357. Examples of the usable insulating material containing silicon include silicon oxide, silicon nitride, and silicon oxynitride. Examples of the usable organic resin include polyimide, polyamide, acrylic, and BCB (benzocyclobutene).

In this embodiment, a silicon oxynitride film is formed by plasma CVD. The thickness of the silicon oxynitride film is desirably 1 to 5 $\mu$m (more desirably 2 to 4 $\mu$m). A silicon oxynitride film, with its small water content, is effective in limiting the degradation of the EL element. The contact holes can be formed by dry etching or wet etching. Considering the problem of electrostatic discharge damage in etching, wet etching is desirable.

When forming the contact holes here, the first interlayer insulating film 356 and the second interlayer insulating film 357 are etched at the same time. Then taking the shape of the contact holes into calculation, a preferable material for the second interlayer insulating film 357 has an etching rate faster than the etching rate of the material of the first interlayer insulating film 356.

Thus obtained are wiring lines 358, 361, 362, and 365 electrically connected to the impurity regions 333, 335, 350 and 353, respectively. A laminate of a Ti film with a thickness of 50 nm and an alloy film (an alloy film of At and Ti) with a thickness of 500 nm is then formed by patterning. Other conductive films may be formed instead.

Next, a transparent conductive film is formed on the laminate to a thickness of 80 to 120 nm and patterned to form an anode 367. (FIG. 5A) The transparent conductive film used as the anode in this embodiment is an indium oxide—tin (ITO) film or an indium oxide film with 2 to 20% of zinc oxide (ZnO) mixed thereto.

The anode 367 is formed so as to directly overlap with the drain wiring line 365, thereby establishing an electric connection with a drain region of a current controlling TFT 404.

Figure 5B:
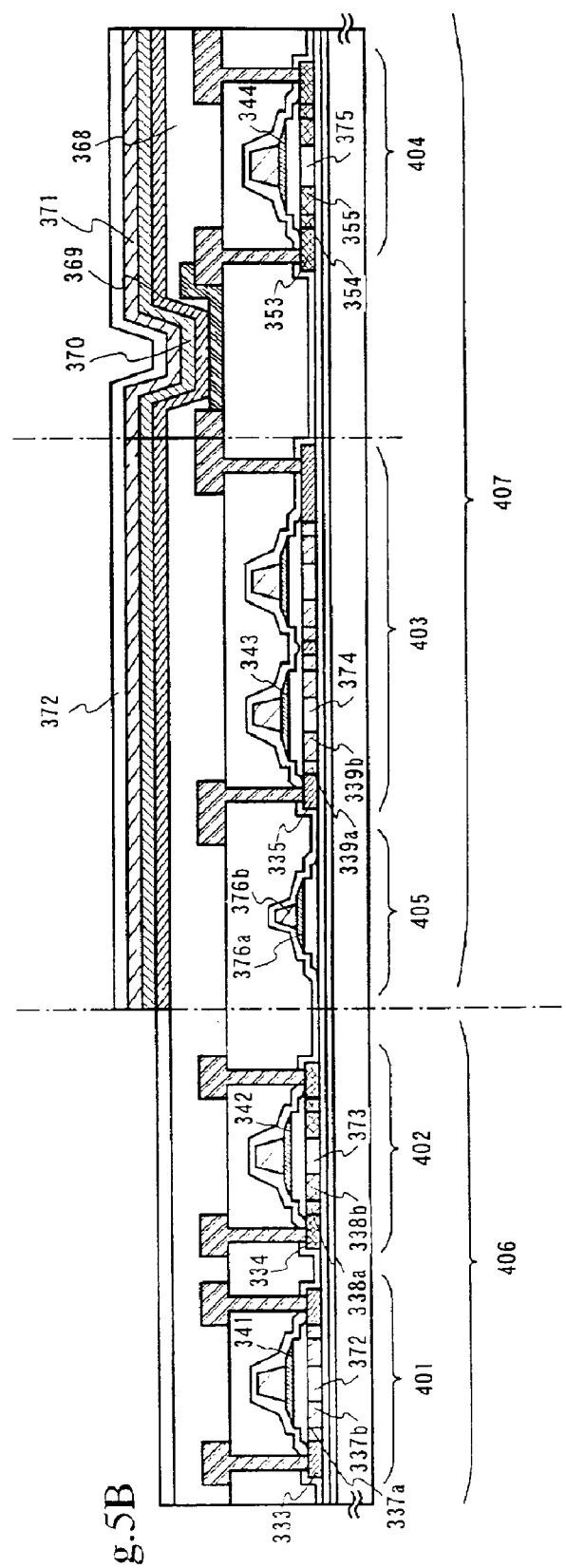

As shown in FIG. 5B, an insulating film containing silicon (a silicon oxide film, in this embodiment) is next formed to a thickness of 500 nm. An opening is formed in the insulating film at a position corresponding to the anode 367 to form a third interlayer insulating film 368 functioning as a bank. When the opening is formed, side walls thereof can readily be tapered by wet etching. If the side walls of the opening are not gentle enough, the level difference causes a serious degradation of the EL layer. Therefore the opening has to be formed with a great care.

Although a silicon oxide film is used as the third interlayer insulating film 368 in this embodiment, an organic resin film such as a polyimide film, a polyamide film, an acrylic film, or a BCB (benzocyclobutene) film may be used in some cases.

Next, the multi-chamber film forming apparatus illustrated in FIG. 2 is used to form an EL layer 369 by the letterpress printing method as shown in FIG. 5B. A cathode (an MgAg electrode) 370 and a protective electrode are then formed by evaporation. Prior to forming the EL layer 369 and the cathode 370, the anode 367 is preferably subjected to heat treatment to remove moisture completely. The cathode of the EL element, the MgAg electrode in this embodiment, may be formed of other known materials.

The EL layer 369 can be formed of materials described in Embodiment Mode. The EL layer in this embodiment has a two-layer structure consisting of a hole transporting layer and a light emitting layer. However, a hole injection layer, an electron injection layer or an electron transporting layer may be added to the two-layer structure. There have been proposed various combinations of the layers for the EL layer, and any one of them can be used in this embodiment.

The hole transporting layer in this embodiment is formed by printing polytetrahydrothiophenylphenylene as a polymer precursor and heating the precursor to transform it into polyphenylene vinylene. The light emitting layer in this embodiment is formed by evaporation of polyvinyl carbazole molecular-dispersed with 30 to 40% of PBD of 1,3,4-oxadiazole derivative, and doping the film with about 1% of coumarin 6 as the center of green light emission.

Although a protective electrode 371 alone can protect the EL layer 369 from moisture and oxygen, it is more desirable to form a passivation film 372. In this embodiment, a silicon nitride film with a thickness of 300 nm is formed as the passivation film 372. The passivation film also can be formed successively without exposing the device to the air after the protective electrode 371 is formed.

The protective electrode 371 is provided to prevent degradation of the cathode 370, and typically is a metal film containing aluminum as its main ingredient. Needless to say, other materials can be used for the electrode. The EL layer 369 and the cathode 370 are very weak against moisture. Therefore it is desirable to protect the EL layer from the outside air by successively forming the films up through formation of the protective electrode 371 without exposing the device to the air.

An appropriate thickness of the EL layer 369 is 10 to 400 nm (typically 60 to 150 nm), and an appropriate thickness of the cathode 370 is 80 to 200 nm (typically 100 to 150 nm).

Thus completed is an EL module structured as shown in FIG. 5B. In the process of manufacturing an EL module according to this embodiment, due to the circuit structure and process, source signal lines are formed from Ta and W that are materials of the gate electrode whereas gate signal lines are formed from Al that is a wiring material for forming the source and drain electrode. However, the source signal lines and the gate signal lines may be formed from other materials.

A driving circuit 406 having an n-channel TFT 401 and a p-channel TFT 402 can be formed on the same substrate on which a pixel portion 407 having a switching TFT 403, a current controlling TFT 404, and a capacitor storage 405 is formed.

The n-channel TFT 401 of the driving circuit 406 has a channel formation region 372; a low concentration impurity region 337b overlapping with a first conductive layer 341 that constitutes a part of a gate electrode (GOLD region 337b); a low concentration impurity region 337a formed outside the gate electrode (LDD region 337a); and a high concentration impurity region 333 functioning as a source region or a drain region. The p-channel TFT 402 has a channel formation region 373; an impurity region 338b overlapping with a first conductive layer 342 that constitutes a part of a gate electrode; an impurity region 338a formed outside the gate electrode; and an impurity region 334 functioning as a source region or a drain region.

The switching TFT 403 of the pixel portion 407 has a channel formation region 374; a low concentration impurity region 339b overlapping with a first conductive layer 343 that constitutes a gate electrode (GOLD region 339b); a low concentration impurity region 339a formed outside the gate electrode (LDD region 339a); and a high concentration impurity region 335 functioning as a source region or a drain region. The current controlling TFT 404 has a channel formation region 375; a low concentration impurity region 355 overlapping with a first conductive layer 344 that constitutes a gate electrode (GOLD region 355); a low concentration impurity region 354 formed outside the gate electrode (LDD region 354); and a high concentration impurity region 353 functioning as a source region or a drain region. The capacitor storage 405 is formed so as to use as one of electrodes a first conductive layer 376a and a second conductive layer 376b to function.

Described next with reference to FIGS. 6A and 6B is how to complete the EL module in the state of FIG. 5B as a light emitting device.

FIG. 6A is a top view of the device that has finished the process up through sealing the EL element. FIG. 6B is a sectional view taken along the line A—A' in FIG. 6A. The dotted lines indicate a source side driving circuit, a pixel portion, and a gate side driving circuit which are denoted by 601, 602, and 603, respectively. Reference symbol 604 denotes a cover member, 605, a first sealing member, and 606, a second sealing member. A sealant 607 is provided in the space surrounded by the first sealing member 605.

Denoted by 608 are wiring lines for sending signals to be inputted to the source side driving circuit 601 and the gate side driving circuit 603, and receive video signals and clock signals from an FPC (flexible printed circuit) 609 that serves as an external input terminal. Although the FPC alone is shown in FIG. 6A, a printed wiring board (PWB) may be attached to the FPC. The light emitting device in this specification refers to the light emitting device itself and the light emitting device with FPC or PWB attached to the device.

Next, the sectional structure of the device will be described with reference to FIG. 6B. The pixel portion 602 and the gate side driving circuit 603 are formed on upper portions of a substrate 610. The pixel portion 602 is composed of a plurality of pixels each having a current controlling TFT 611 and an anode 612 that is electrically connected to a drain of the TFT 611. The gate side driving circuit 603 is composed of a CMOS circuit (See FIGS. 5A and 5B) obtained by combining an n-channel TFT 613 and a p-channel TFT 614.

The anode 612 has a bank 615 on each side thereof. On the anode 612, an EL layer 616 and a cathode 617 of the EL element are formed.

The cathode 617 also functions as a wiring line shared by all the pixels, and is electrically connected to the FPC 609 through a connection wiring line 608. The elements included in the pixel portion 602 and in the gate side driving circuit 603 are all covered with the cathode 617 and a passivation film 618.

The cover member 604 is bonded by the first sealing member 605. To secure the distance between the cover member 604 and the EL element, a spacer made of a resin film may be provided. The sealant 607 fills the space surrounded by the first sealing member 605. Epoxy based resins are preferably used for the first sealing member 605 and the sealant 607. The first sealing member 605 is desirably a material that allows as small an amount of moisture and oxygen as possible to transmit. The sealant 607 may contain a substance having a hygroscopic effect or a substance having an anti-oxidizing effect.

The sealant 607 provided so as to cover the EL element also functions as an adhesive for bonding the cover member 604. The material used in this embodiment for a plastic substrate constituting the cover member 604 is FRP (fiberglass-reinforced plastics), PVF (polyvinyl fluoride), Mylar, polyester or acrylic.

After the cover member 604 is bonded using the sealant 607, the second sealing member 606 is provided so as to cover side faces (exposed faces) of the sealant 607. The second sealing member 606 can be formed of the same material as the first sealing member 605.

With the structure described above, the EL element is enclosed in the sealant 607, thereby shutting the EL element out of the surroundings completely and preventing permeation of external substances, such as moisture and oxygen, that accelerate degradation of the EL layer through oxidization. Thus a highly reliable light emitting device can be obtained.

[Embodiment 2]

Embodiment 1 shows a process from forming an EL layer through sealing an EL element with the use of a multichamber film forming apparatus. Described in Embodiment 2 with reference to FIGS. 7A and 7B is how to conduct a series of processing from forming the EL layer through sealing the EL element using an in-line film forming apparatus.

FIG. 7A is a top view of the in-line film forming apparatus and FIG. 7B is a side view thereof. Reference symbol 701 denotes a loader unit (transfer unit) for substrates to be processed. As described in Embodiment 1, each substrate to be processed has finished up through forming an anode (or a cathode) of an EL element before setting in the loader unit 701.

An EL layer is printed on the substrate in a printing chamber 702 provided with a letterpress printing device. The printing chamber 702 is composed of an ink tank 703, a doctor bar 704, an anilox roll 705, and a printing roll 706 as shown in FIG. 7B. When an EL forming material is poured from the ink tank 703, the EL forming material is held to the anilox roll 705 and then is applied to convex of the printing roll 706. At this point, the doctor bar 704 adjusts the amount of the EL forming material poured from the ink tank 703 so that the EL forming material is held to the surface of the anilox roll evenly.

The EL forming material is printed at positions (a film forming unit 709) where the convex of the printing roll 706 is brought into contact with the substrate that moves horizontally (in the direction indicated by the arrow 1) at the same speed as the printing roll 706.

The substrate at this point is positioned using a monitor (not shown) for alignment.

The printing chamber 702 is filled with inert gas or set to a solvent atmosphere containing a solvent that constitutes the EL forming material. The pressure in the printing chamber is kept at the atmospheric pressure or near the atmospheric pressure (typically 1 to 2 atm., preferably 1.1 to 1.5 atm.). The pressure is adjusted by a pressure adjusting mechanism 707. The printing chamber can be set to a solvent atmosphere by putting a solvent in a solvent tray 708.

In this embodiment, a hole injection layer, a hole transporting layer, and a light emitting layer are formed by printing from polymer materials.

First, the hole injection layer and the hole transporting layer are printed. Used here is an aqueous solution of PEDOT (polythiophen derivative) obtained by dissolving PEDOT in water.

The printed aqueous solution then has its moisture removed by vaporization in a drying chamber 710 to form the hole injection layer and the hole transporting layer. At this point, the substrate is heated by a hot plate unit 711 at 80 to 150° C.

The light emitting layer includes a red light emitting layer, a green light emitting layer, and a blue light emitting layer. An EL forming material for the red light emitting layer contains cyanopolyphenylene vinylene, an EL forming material for the green light emitting layer contains polypheylene vinylene, and an EL forming material for the blue light emitting layer contains polypheylene vinylene or polyalkylphenylene, respectively, which are printed in the printing chamber. An appropriate thickness of each light emitting layer is 30 to 150 nm (preferably 40 to 100 nm).

The substrate on which the EL forming materials are printed is again placed in the drying chamber 710 to vaporize solvents in the EL forming materials while EL materials therein are left. This processing is achieved by heating the substrate to be processed on the hot plate unit 711 provided in the drying chamber 710. The temperature in this processing is preferably 20 to 150° C., but can vary depending on the volatileness of the solvents used.

After the EL layer composed of the hole injection layer, the hole transporting layer, and the light emitting layer is formed in accordance with the manner above, a conductive film to serve as a cathode (or an anode) of the EL element is formed by evaporation in an evaporation chamber 712. The evaporation chamber 712 has therein a film forming unit 713. A specific example of the conductive film formed in the film forming unit 713 is an MgAg film or an Al—Li alloy film (an alloy film of aluminum and lithium), which serves as the cathode of the EL element. A material used in evaporation is provided in an evaporation source 714.

The evaporation chamber 712 can be used to form a part of the EL layer as well as to form the electrode.

The EL element is thus completed through the above process. Then a sealing chamber 715 conducts the final processing of enclosing the EL element in an airtight space. The processing is carried out for protecting the completed EL element from oxygen and moisture. The EL element is automatically enclosed using a sealing member, or is enclosed using either a thermally curable resin or a UV-curable resin.

In the film forming apparatus shown in FIGS. 7A and 7B, a mechanism for irradiating ultraviolet rays (hereinafter referred to as ultraviolet ray irradiation mechanism) 716 is provided in the sealing chamber 715. The ultraviolet ray irradiation mechanism 716 emits ultraviolet rays to cure the UV-curable resin on the substrate in a film forming unit 717. The sealing chamber 715 may be set to reduced pressure if a vacuum pump is installed in the sealing chamber 715. When the above enclosing step is automatically conducted through operation of a robot, the reduced pressure prevents oxygen and moisture from entering. On the other hand, the sealing chamber 715 may be pressurized. In this case, pressurization is performed while purging with nitrogen gas or noble gas of high purity to prevent oxygen or other contaminants from entering from the outside air.

After processing in the sealing chamber 715, the substrate is transferred to an unloader 718. Thus completed is the process by the in-line film forming apparatus. In this film forming apparatus, the processing chambers are separated from one another and environments suitable for the processing chambers are set respectively. It is beneficial to set the film forming apparatus under an inert gas atmosphere that contains no moisture and does not affect the EL element.

As described above, with the film forming apparatus shown in FIGS. 7A and 7B, the EL element is formed and enclosed completely in an airtight space without exposure to the outside air. The apparatus thus can manufacture a light emitting device with high reliability. Moreover, the in-line system contributes to manufacture of a light emitting device with high throughput.

The structure of this embodiment can be combined freely with the structure of Embodiment 1.

[Embodiment 3]

This embodiment gives an explanation on how to form a multi-color EL layer by the letterpress printing method shown in Embodiment 1. In FIG. 8A, reference symbol 801 denotes a printing roll provided in a printing chamber. The surface of the printing roll 801 is provided with a letterpress plate formed by etching or the like. The letterpress plate has plural pixel portion patterns 802 in order to form plural sheets of light emitting device on a single substrate.

Looking at the enlarged view of the pixel portion patterns 802, each pattern has convex 803 at positions corresponding to positions of a plurality of pixels. The configuration of the convex 803 is different for each color since a plurality of colors are to be obtained by letterpress in this embodiment.

For instance, when an EL forming material is printed using convex 803a shown in FIG. 8B, the pixel portion of first color pixels are formed as illustrated by the solid line regions in FIG. 8B.

Then another EL forming material, which is different from the one for the first color, is printed using convex 803b shown in FIG. 8C to form second color pixels in places different from the first color pixels, as shown in FIG. 8C.

Still another EL forming material, which is different from the ones for the first and second colors, is printed using convex 803c shown in FIG. 8D to form third color pixels in places different from the first color pixels and the second color pixels, as shown in FIG. 8D.

Thus EL forming materials of three colors are printed in the pixel portion through the steps above. The number of colors for the EL forming materials is not limited to three but may be two or more than three.

The printing method here requires plural convex with different configurations. To meet this requirement, a plurality of printing chambers are provided. Alternatively, convex of one configuration for one color is switched to convex of another configuration for another color after an EL forming material of the one color is printed on all the substrates in a single printing chamber.

Figure 9:
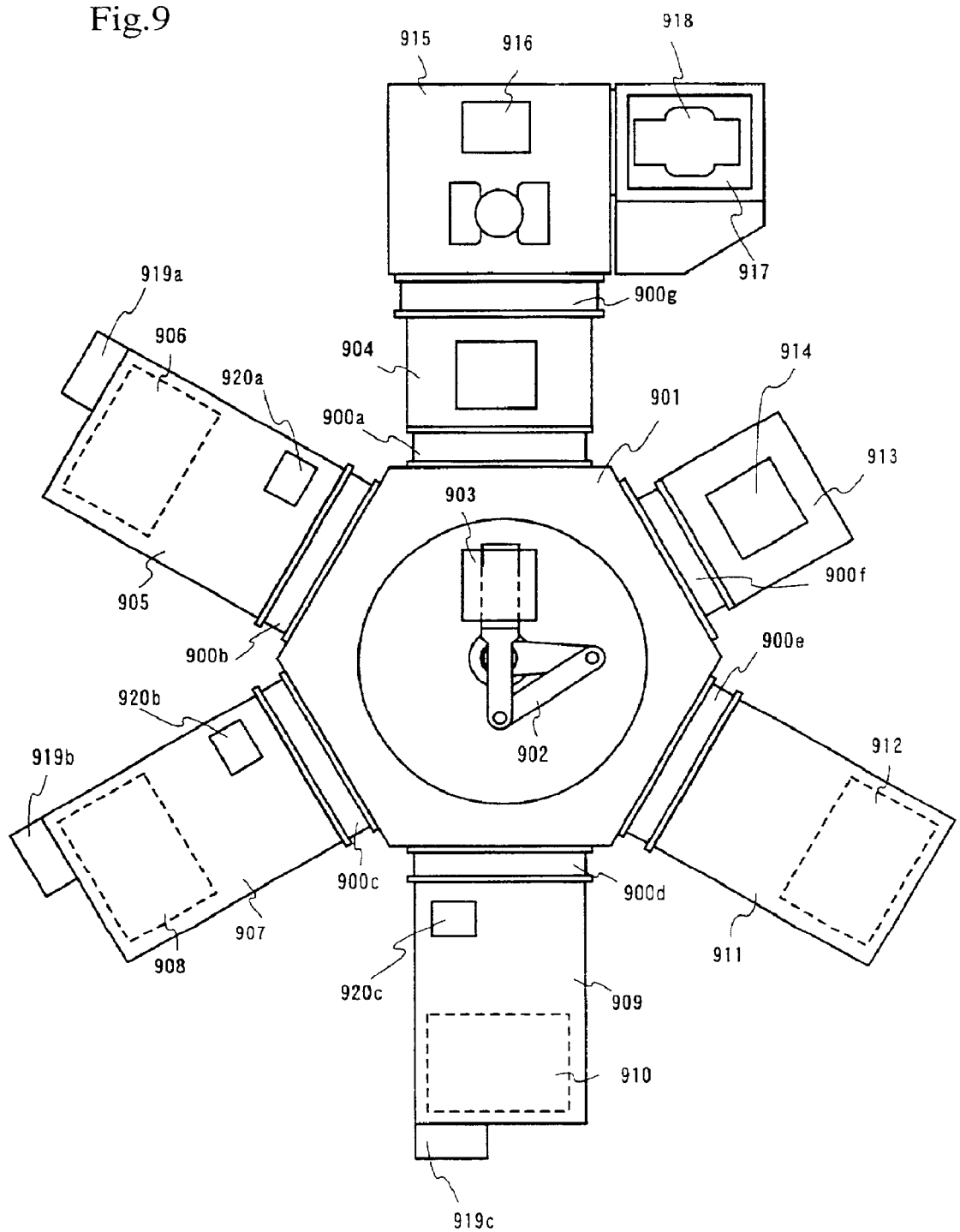
FIG. 9 is a diagram showing a multi-chamber film forming apparatus.

Here, FIG. 9 shows a multi-chamber film forming apparatus provided with a plurality of printing chambers. In FIG. 9, reference symbol 901 denotes a transfer chamber where a transfer mechanism (A) 902 is installed to transfer substrates 903. The transfer chamber 901 is set to a reduced pressure atmosphere and is connected to respective processing chambers through gates. The transfer mechanism (A) 902 hands the substrates to the processing chambers while the gates are opened.

The pressure in the transfer chamber 901 can be reduced by a vacuum pump such as an oil rotary pump, a mechanical booster pump, a turbomolecular pump, or a cryopump. Preferably, a cryopump is used for its effectiveness in removing moisture.

The processing chambers will be described below respectively. Of the processing chambers, those directly connected to the transfer chamber 901 have vacuum pumps (not shown) since the transfer chamber 901 is set to a reduced pressure atmosphere. Examples of usable vacuum pumps are given above and include an oil rotary pump, a mechanical booster pump, a turbomolecular pump, and a cryopump.

First, denoted by 904 is a loading chamber in which the substrates are set, and which is also called a load lock chamber. The loading chamber 904 is connected to the transfer chamber 901 through a gate 900a, and a carrier (not shown) having the substrates 903 set is placed in the loading chamber 904. The loading chamber 904 may be divided into two rooms with one for bringing the substrates in and the other for sending the substrates out. The loading chamber 904 is provided with, as well as the vacuum pump mentioned above, a purge line for introducing nitrogen gas or noble gas with high purity.

Described next are printing chambers (A), (B), and (C) for forming EL materials into films by the letterpress printing method, which are denoted by 905, 907, and 909, respectively.

In this embodiment, the printing chamber (A) 905 has a film forming unit 906 where a hole injection layer and a red right emitting layer as a first color light emitting layer are formed. Known materials can be used for the hole injection layer and the red light emitting layer.

The printing chamber (A) 905 is connected to the transfer chamber 901 through a gate 900b. The printing chamber (A) 905 is set to a nitrogen or other inert gas atmosphere, or a solvent atmosphere containing a solvent that constitutes an EL forming material. Further, the pressure in the printing chamber (A) 905 is kept at the atmospheric pressure or near the atmospheric pressure (1 to 2 atm., typically, 1.1 to 1.5 atm., preferably). The pressure is adjusted by a pressure adjusting mechanism 919a. If the printing chamber (A) is set to the solvent atmosphere, the solvent is put in a solvent tray 920a.

Next, an EL material of a second color is formed into a film in a film forming unit 908 in the printing chamber (B) 907. The printing chamber (B) 907 is connected to the transfer chamber 901 through a gate 900c. In this embodiment, a hole injection layer and a green light emitting layer are formed in the film forming unit 908 in the printing chamber (B) 907. Known materials can be used for the hole injection layer and the green light emitting layer.

The printing chamber (B) 907 is set to a nitrogen or other inert gas atmosphere, or a solvent atmosphere containing a solvent that constitutes an EL forming material. The pressure in the printing chamber (B) 907 is kept at the atmospheric pressure or near the atmospheric pressure (1 to 2 atm., typically, 1.1 to 1.5 atm., preferably). The pressure is adjusted by a pressure adjusting mechanism 919b. If the printing chamber (B) 907 is set to the solvent atmosphere, the solvent is put in a solvent tray 920b.

Next, an EL material of a third color is formed into a film in a film forming unit 910 in the printing chamber (C) 909. The printing chamber (C) 909 is connected to the transfer chamber 901 through a gate 900d. In this embodiment, a hole injection layer and a blue light emitting layer are formed in the film forming unit 910 in the printing chamber (C) 909. Known materials can be used for the hole injection layer and the blue light emitting layer.

The printing chamber (C) 909 is set to a nitrogen or other inert gas atmosphere, or a solvent atmosphere containing a solvent that constitutes an EL forming material. The pressure in the printing chamber (C) 909 is kept at the atmospheric pressure or near the atmospheric pressure (1 to 2 atm., typically, 1.1 to 1.5 atm., preferably). The pressure is adjusted by a pressure adjusting mechanism 919c. If the inside of the printing chamber (C) 909 is set to the solvent atmosphere, the solvent is put in a solvent tray 920c.

Next, a processing chamber denoted by 911 is an evaporation chamber for forming a conductive film that is to serve as an anode or a cathode of an EL element (in this embodiment, a metal film to serve as the cathode) by evaporation. The evaporation chamber 911 is connected to the transfer chamber 901 through a gate 900e. The evaporation chamber 911 according to this embodiment has the structure shown in FIG. 2. The evaporation chamber 911 has therein a film forming unit 912. In this embodiment, an Al—Li alloy film (an alloy film of aluminum and lithium) is formed as the conductive film to serve as the cathode of the EL element in the film forming unit 912. Alternatively, aluminum may be subjected to co-evaporation with an element which belongs to Group 1 or Group 2 in the periodic table to form the conductive film.

Next, denoted by 913 is a drying chamber for vaporizing the solvents included in the EL forming material after the EL layer is printed in the printing chambers. The drying chamber 913 is connected to the transfer chamber 901 through a gate 900f. A hot plate unit 914 is provided in the drying chamber to heat the substrate at 20 to 120° C.

Next, a processing chamber denoted by 915 is a sealing chamber, which is connected to the loading chamber 904 through a gate 900g. For the description of the sealing chamber 915, Embodiment 1 can be referred to. The sealing chamber 915 has therein a ultraviolet ray irradiation mechanism 916 as in Embodiment 1. The sealing chamber 915 is also connected to a handing-over chamber 917. The handing-over chamber 917 is provided with a transfer mechanism (B) 918 to transfer the substrate after sealing the EL element in the sealing chamber 915 to the handing-over chamber 917. Again, Embodiment 1 can be referred to for the description of the handing-over chamber 917.

As described above, with the film forming apparatus shown in FIG. 9, the EL element is formed and enclosed completely in an airtight space without exposure to the outside air. Then, it becomes possible to manufacture a light emitting device with high reliability.

The structure of this embodiment can be combined freely with the structure of Embodiment 1 or Embodiment 2.
[Embodiment 4]

The case of using top gate type TFTs was explained in Embodiment 1, but the present invention is not limited to a TFT structure, and may also be implemented using a bottom gate type TFT (typically an inverted stagger type TFT). Further, the inverted stagger type TFT may be formed by any means.

It is easy to manufacture the inverted stager type TFT with fewer processes than the top gate type TFT, and therefore extremely advantageous for lowering manufacturing costs, an object of the present invention. Note that it is possible to freely combine the constitution of this embodiment with any of the constitution of Embodiments 1 to 3.
[Embodiment 5]

In driving the light-emitting device of the present invention, analog driving can be performed using an analog signal as an image signal, and digital driving can be performed using a digital signal.

When analog driving is performed, the analog signal is transmitted to a source wiring of a switching TFT, and the analog signal which contains gray scale information becomes the gate voltage of a current control TFT. The current to flow in an EL element is then controlled by the current control TFT, the emitting intensity of the EL element is controlled, and gray scale display is performed. In this case, it is preferable to operate the current control TFT in a saturation region.

On the other hand, when digital driving is performed, it differs from the analog type gray scale display, and gray scale display is performed by time division driving (time ratio gray scale driving). Namely, by regulating the length of the emission time, color gray scales can be made to be seen visually changing. In this case, it is preferable to operate the current control TFT in the linear region.

The EL element has an extremely fast response speed in comparison to a liquid crystal element, and therefore it is possible to drive high speed. Accordingly, the EL element is suitable for time division driving, in which one frame is partitioned into a plural number of subframes and then gray scale display is performed.

The present invention is a technique related to the element structure, and therefore any method of driving may thus be used.
[Embodiment 6]

In Embodiment 1, an organic EL material is used as an EL layer, but the present invention can also be implemented using an inorganic EL material. However, current inorganic EL materials need an extremely high driving voltage, and therefore a TFT, which has voltage resistance characteristics that can withstand the driving voltage, must be used in cases of performing analog driving.

Alternatively, if inorganic EL materials with lower driving voltages than conventional inorganic EL materials are developed, then it is possible to apply them to the present invention.

Further, it is possible to freely combine the constitution of this embodiment with any of the constitutions of Embodiments 1 to 5.
[Embodiment 7]

The light-emitting display device of the present invention, is a self light emitting type, therefore compared to a liquid crystal display device, it has excellent visible properties and is broad in an angle of visibility. Accordingly, the light-emitting display device can be applied to a display portion in various electronic devices. For example, in order to view a TV program or the like on a large-sized screen, the light-emitting display device in accordance with the present invention can be used as a display portion of a light-emitting display having a diagonal size of 30 inches or larger (typically 40 inches or larger).

The display includes all kinds of displays to be used for displaying information, such as a display for a personal computer, a display for receiving a TV broadcasting program, a display for advertisement display. Moreover, the light-emitting device in accordance with the present invention can be used as a display portion of other various electric devices.

As other electronic equipments of the present invention there are: a video camera; a digital camera; a goggle type display (head mounted display); a car navigation system; a sound reproduction device (a car audio stereo and an audio set and so forth); a notebook type personal computer; a game apparatus; a portable information terminal (such as a mobile computer, a portable telephone, a portable game machine, or an electronic book); and an image playback device equipped with a recording medium (specifically, device provided with a display portion which plays back images in a recording medium such as a digital versatile disk player (DVD), and displays the images). Specific examples of those electronic equipments are shown in FIGS. 10A to 11C.

Figure 10A:
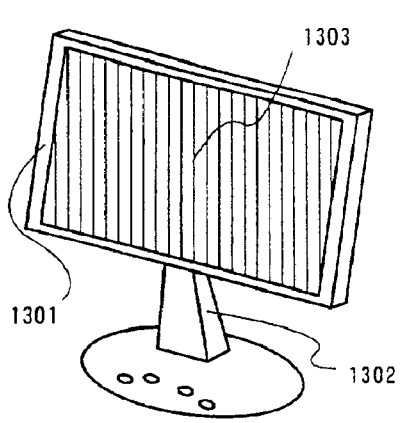
FIGS. 10A to 10F are diagrams showing specific examples of electric equipment.

FIG. 10A shows a display device containing a casing 1301, a support stand 1302, and a display portion 1303. The light-emitting device of the present invention can be used as the display portion 1303. Such a light-emitting device is a self light emitting type so that a back light is not necessary. Thus, the display portion can be made thinner than that of a liquid crystal display.

Figure 10B:
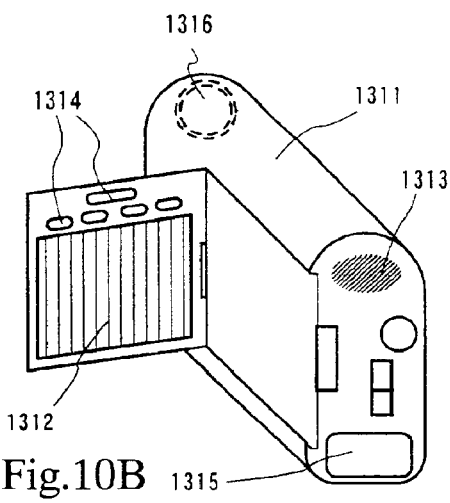

FIG. 10B shows a video camera, and contains a main body 1311, a display portion 1312, a sound input portion 1313, operation switches 1314, a battery 1315, and an image receiving portion 1316. The light-emitting device of the present invention can be used as the display portion 1312.

Figure 10C:
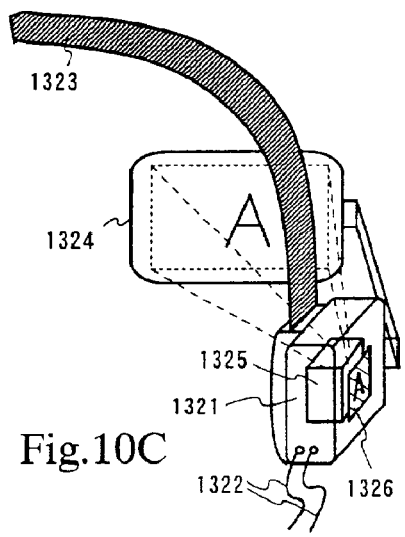

FIG. 10C shows a part of a head mounted display device (right handed side), and contains a main boy 1321, a signal cable 1322, a head fixation band 1323, a display portion 1324, an optical system 1325 and a display device 1326. The light-emitting device of the present invention can be used as the display device 1326.

Figure 10D:
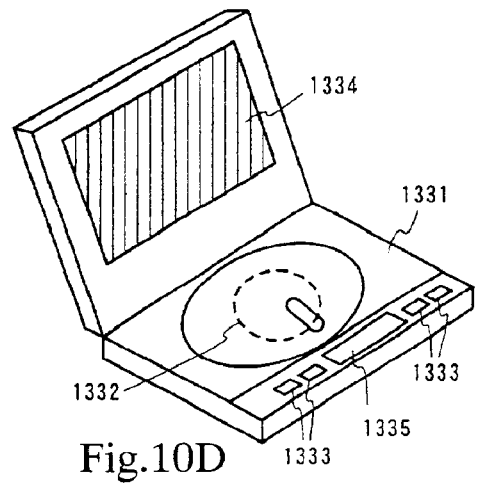

FIG. 10D is an image playback device equipped with a recording medium (specifically, a DVD playback device), and contains a main body 1331, a recording medium (such as a DVD and so forth) 1332, operation switches 1333, a display portion (a) 1334, and a display portion (b) 1335. The display portion (a) 1334 is mainly used for displaying image information. The display portion (b) 1335 is mainly used for displaying character information. The electronic device and the driving method of the present invention can be used as the display portion (a) 1334 and as the display portion (b) 1335. Note that the image playback device equipped with the recording medium includes devices such as domestic game machines.

Figure 10E:
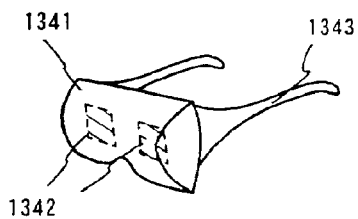

FIG. 10E shows a goggle type display device (a head mounted display device), and contains a main body 1341, a display portion 1342, and an arm portion 1343. The light-emitting device of the present invention can be used as the display portion 1342.

Figure 10F:
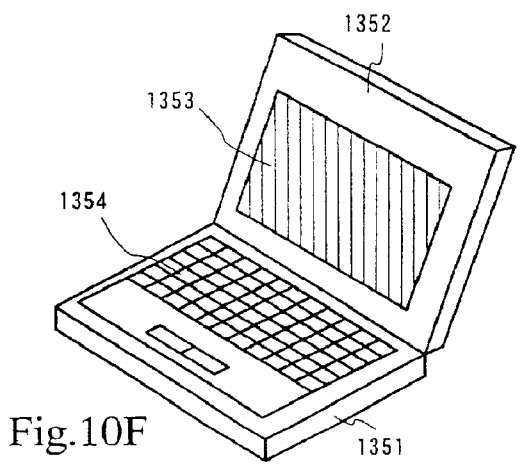

FIG. 10F is a personal computer, and contains a main body 1351, a casing 1352, a display portion 1353, and a keyboard 1354. The light-emitting device of the present invention can be used as the display portion 1353.

Note that if the luminance of EL material increases in the future, then it will become possible to use the light-emitting device of the present invention in a front type or a rear type projector by expanding and projecting light containing output image information with a lens or the like.

Further, the above electronic devices display often information transmitted through an electronic communication circuit such as the Internet and CATV (cable TV), and particularly situations of displaying moving images is increasing. The response speed of EL materials is so high that the light-emitting device of the present invention are good for display of moving image.

Figures 11A, 11B, 11C:
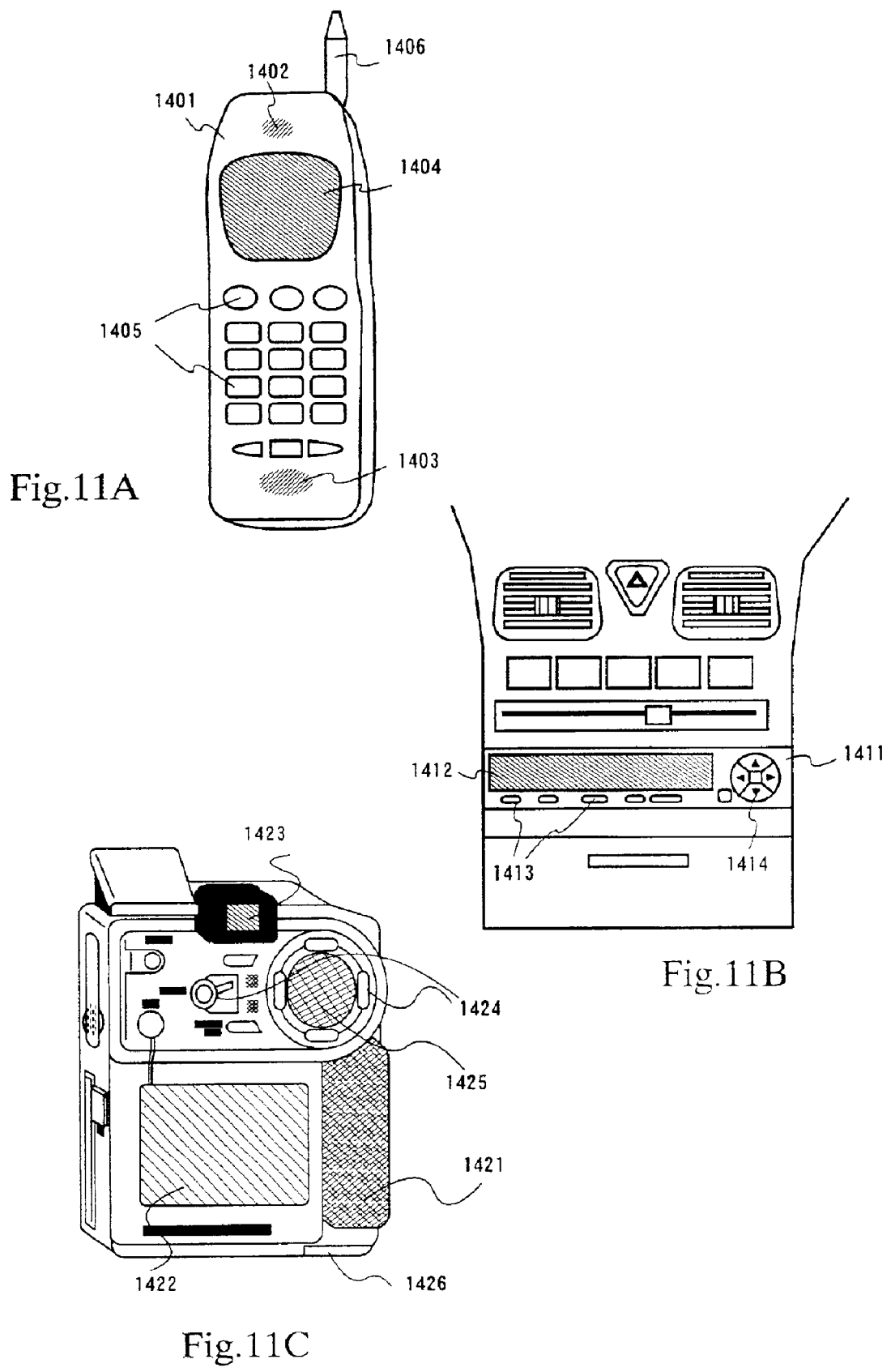
FIGS. 11A to 11C are diagrams showing specific examples of the electric equipment.

FIG. 11A shows a portable telephone, and contains a main body 1401, a sound output portion 1402, a sound input portion 1403, a display portion 1404, operation switches 1405, and an antenna 1406. The light emitting device of the present invention can be used as the display portion 1404. Note that by displaying white color characters in a black color background, the display portion 1404 can suppress the power consumption of the portable telephone.

FIG. 11B shows a sound reproduction device, in a concrete term, a car audio stereo, and contains a main body 1411, a display portion 1412, and operation switches 1413 and 1414. The light-emitting device of the present invention can be used as the display portion 1412. Further, a car mounting audio stereo is shown in this embodiment, but a portable type or a domestic type sound reproduction device may also be used. Note that, the display portion 1414 can suppress the power consumption by displaying white color character in a black color background, particularly in the portable sound reproduction device. Particularly it have an effect on the portable sound reproduction device.

FIG. 11C shows a digital camera, and contains a main body 1421, a display portion (A) 1422, an eye piece portion 1423, and an operation switches 1424, a display portion (B) 1425, a battery 1426. The electronic device of the present invention can be used as the display portion (A) 1422 and the display portion (B) 1425. Note that, in the case that the display portion (B) 1425 is used as the operation panel, the power consumption of the digital camera can suppress by displaying white color characters in a black color background.

In the case of the portable electronic device shown in this embodiment, the sensor portion is provided as a method of lowering the power consumption, which perceives the external light and functions to lower the brightness of display when it is used in the dark.

As described above, the application range of this invention is extremely wide, and it may be used for electric devices in various fields. Further, the electronic device of this embodiment may be obtained by freely combining any of the structures shown in Embodiments 1 to 6.

[Embodiment 8]

Figure 12:
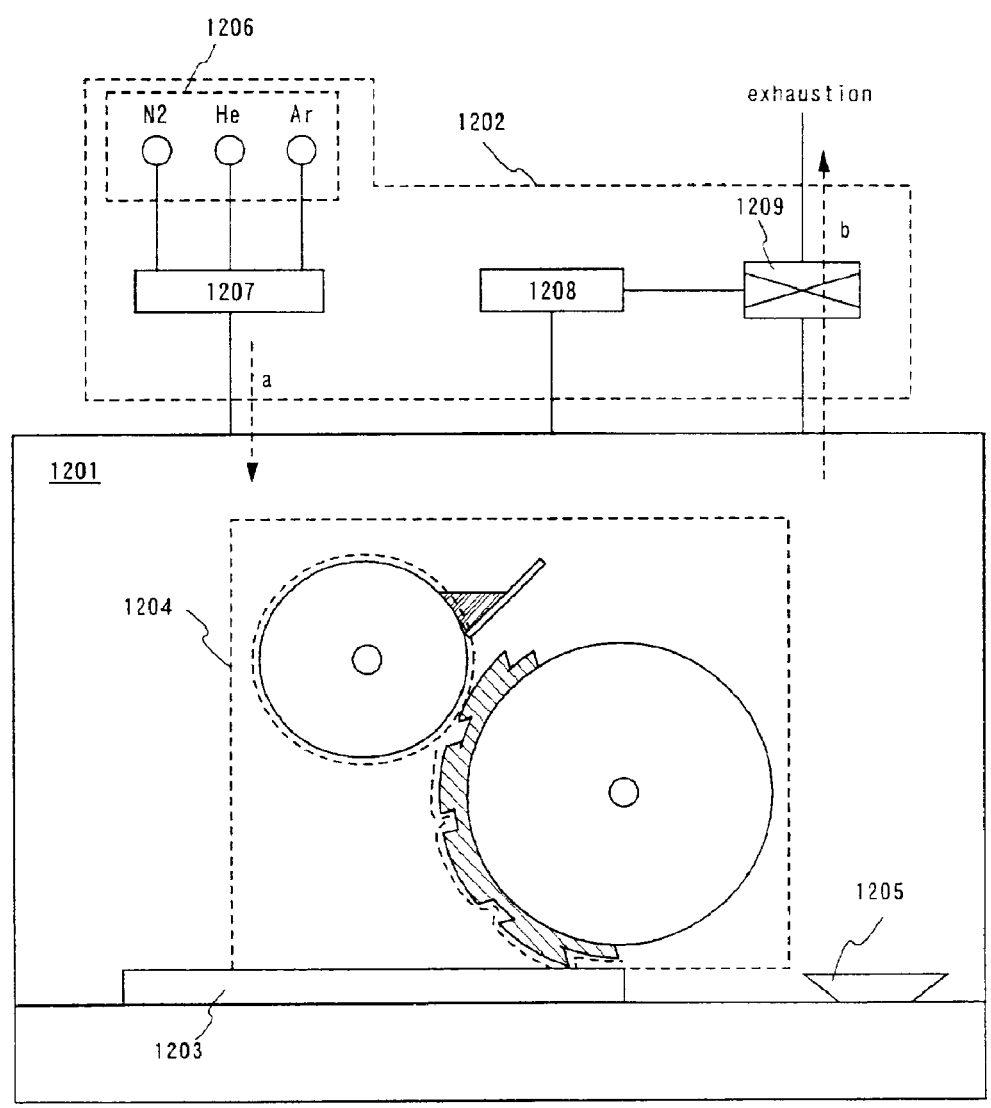
FIG. 12 is a diagram illustrating a pressure adjusting mechanism.

In this embodiment, the pressure adjusting mechanism in the present invention is explained in this embodiment. The pressure adjusting mechanism 1202 connected with a printing chamber 1201 is shown in FIG. 12. In this embodiment, the processing chamber to form an EL layer by a printing method is referred to as a printing chamber.

Figure 1A:
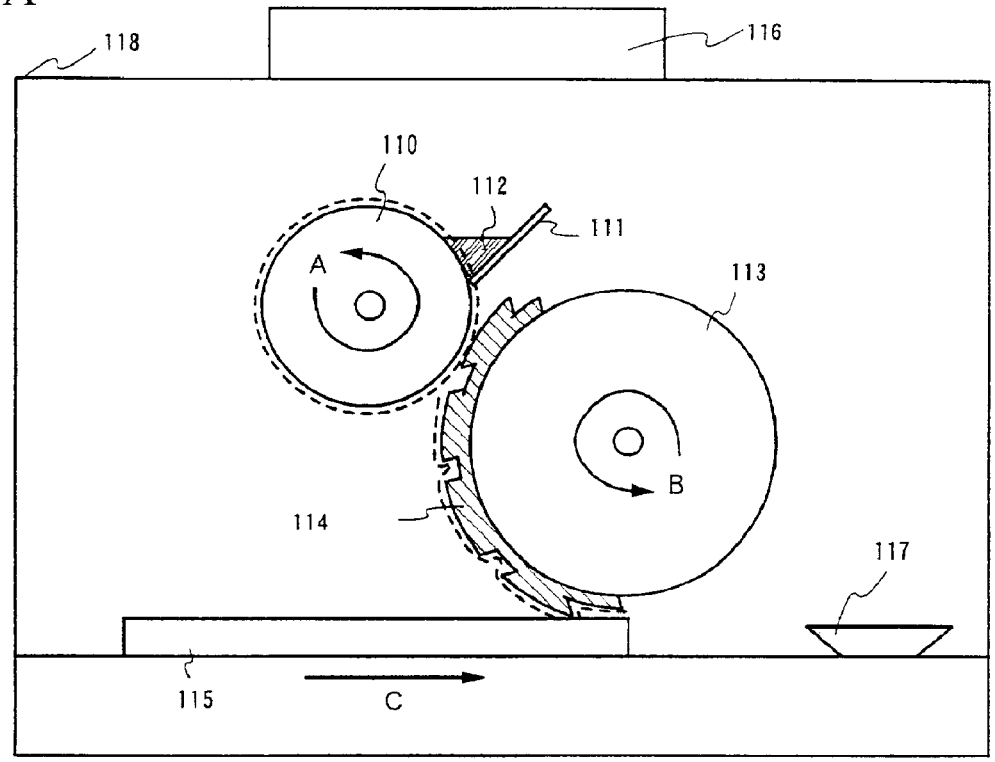
FIGS. 1A to 1C are diagrams illustrating the principle of a letterpress printing method.
Figure 1B:
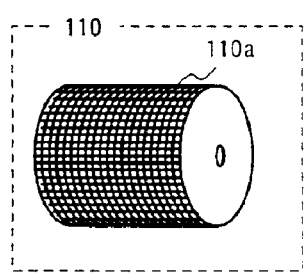
Figure 1C:
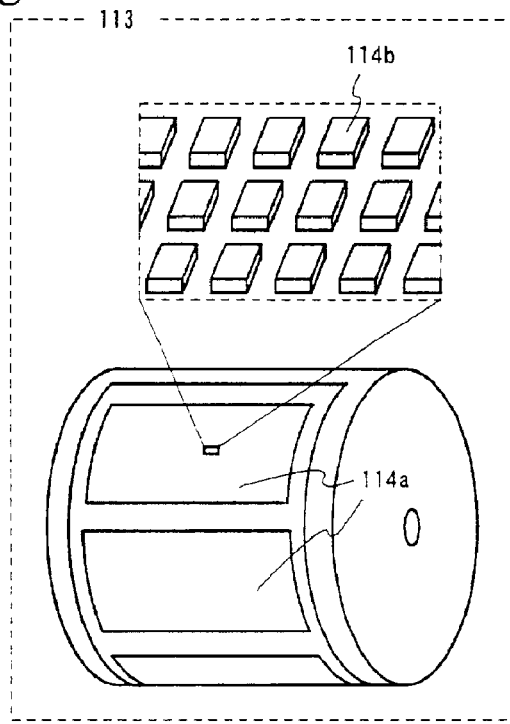

A printing device 1204 to form an EL layer on a substrate 1203 is equipped in the printing chamber 1201. The explanation of the printing chamber 1201 is omitted because the composition is as same as that explained in FIG. 1. Further, a solvent tray 1205 is equipped in the printing chamber 1201. In the solvent tray 1205, the following solvent is prepared; toluene, xylene, chlorobenzene, dichlorobenzene, anisole, chloroform, dichloromethan, γ-butyrolactone, butyrocellosolve, cyclohexane, NMP (N-methyl-2-pyrolidone), cyclohexanone, dioxane or THF (tetrahydrofuran).

It is possible to make the printing chamber 1201 a solvent atmosphere because the solvent provided in the solvent tray 1205 volatilizes when the printing chamber 1201 is compressed by the pressure adjusting mechanism 1202. However, the solvent tray 1205 is not necessarily provided, prepared if necessary.

Next, the pressure adjusting mechanism 1202 in this embodiment is explained. In the pressure adjusting mechanism 1202, there are cylinders 1206 provided with nitrogen, helium and argon, a compressor 1207 to compress gases; a sensor 1208 to measure the internal pressure of the printing chamber 1201 and exhaustion valve 1209 equipped in a pipe arrangement to exhaust internal gases in the printing chamber 1201.

The gas compressed by the compressor 1207 is introduced to the printing chamber 1201 (the direction indicated by an arrow a). The sensor 1208 is connected to the exhaustion valve 1209 to control open and close of the exhaustion valve 1209 according to the internal pressure of the printing chamber 1201. The sensor 1208 has a pressure gage, and its specification is assumed to be 0 to 1.3 MPa. Specifically, when the internal pressure of the printing chamber 1201 is lower than the desired pressure, the exhaustion valve 1209 is closed, and when higher than the desired pressure, the exhaustion valve 1209 is opened to control the pressure in the printing chamber 1201 by exhausting gases in the printing chamber 1201 to the direction indicated by an arrow b.

Further, the printing chamber 1201 is produced by SUS, and has a pressure resistance of 0.8 MPa/cm$^2$ (a designed pressure resistance is 1.5 MPa/cm$^2$). It is preferable to provide a safety valve and a destruction valve to secure safety. The exhaustion valve 1209 has a pressure resistance of 0.9 MPa/cm$^2$.

Therefore, the pressure in the printing chamber 1201 can be controlled. The constitution of the present invention can be implemented as all pressure adjusting mechanism shown in Embodiments 1 to 7.

[Embodiment 9]

The description given in this embodiment is a case of a pressure adjusting mechanism according to the present invention which has a structure different from the one shown in Embodiment 8. In this embodiment, a processing chamber for forming an EL layer by printing is called a printing chamber.

Figure 13:
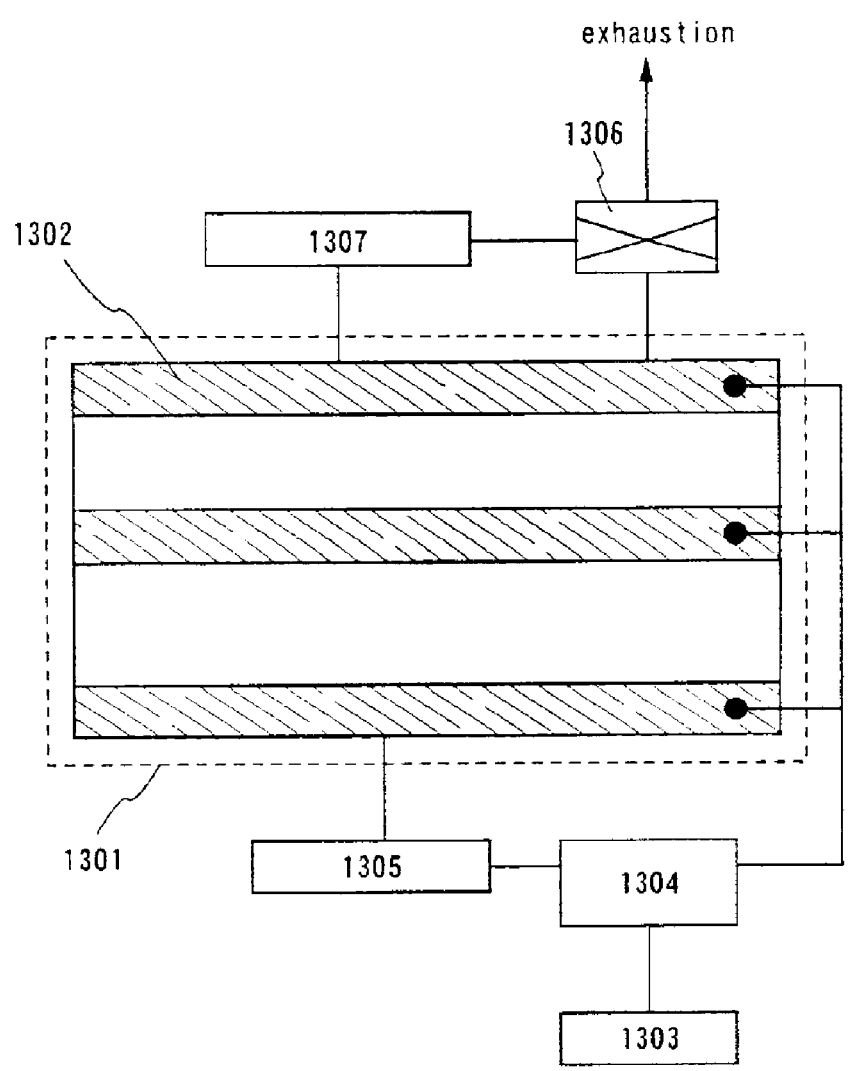
FIG. 13 is a diagram illustrating a pressure adjusting mechanism.

In the pressure adjusting mechanism of this embodiment, a printing chamber 1301 is heated by a plurality of heaters 1302 provided outside the printing chamber 1301 for pressurization as shown in FIG. 13. The heaters 1302 are connected to a power source 1303. Between the heaters 1302 and the power source 1303, a variable resistor 1304 is provided. The variable resistor 1304 is used to control the electric power given to the heaters 1302 from the power source.

The variable resistor 1304 is provided with a first sensor 1305 for measuring the pressure in the printing chamber 1301 and controlling the variable resistor in accordance with the measured pressure. Thus the electric power given to the heaters 1302 from the power source 1303 is controlled. The specification of a pressure gauge set in the first sensor 1305 is in a range of 0 to 1.3 MPa.

By controlling the electric power given to the heaters as above, the temperature at which the heaters 1302 heat the printing chamber 1301 can be controlled. As a result, the pressure in the printing chamber can be controlled.

A solvent tray with a solvent provided therein may be provided in the printing chamber 1301 as in Embodiment 8. Then the printing chamber 1301 is filled with a vaporized solvent when the printing chamber 1301 is heated to reach or exceed a temperature at which the solvent is vaporized. The solvent to be put in the solvent tray may be identical with the solvent that is contained in an EL forming material.

The arrangement of the heaters 1302 is not limited to the one shown in FIG. 13, and can be modified as long as the printing chamber 1301 is heated and pressurized.

The printing chamber 1301 in this embodiment is further provided with a second sensor 1307. The second sensor 1307 measures the pressure in the printing chamber 1301, and controls opening and closing of an exhaustion valve 1306 in accordance with the measured pressure in the printing chamber 1301.

The second sensor 1307 is connected to the printing chamber 1301 and to the exhaustion valve 1306, and a pressure gauge of the second sensor 1307 can measure the pressure in the printing chamber 1301. The specification of the pressure gauge thereof is in a range of 0 to 1.3 MPa. When the pressure in the printing chamber is lower than a desired pressure, the exhaust valve 1306 is closed whereas the exhaustion valve 1306 is opened to exhaust gas from the printing chamber 1301 when the pressure in the chamber is higher than the desired pressure. Thus the pressure in the printing chamber 1301 is adjusted.

The printing chamber 1301 is SUS-made, and has a pressure resistance of 0.8 MPa/cm$^2$ (designed pressure resistance is 1.5 MPa/cm$^2$). In order to ensure the safety, it is preferable to a safety valve, a breaker valve and the like. The exhaustion valve 1306 which has a pressure resistance of 0.9 MPa/cm suitable for use.

With the mechanism above, the processing chamber 1301 can be pressurized. The structure of this embodiment can be applied to all the pressure adjusting mechanisms in Embodiments 1 through 8.

The present invention makes it possible to form an EL layer by printing without the problem regarding the volatileness of a solvent, which has been unavoidable in prior art of EL formation by printing. Therefore cost in manufacturing a light emitting device can be lowered. Manufacturing cost is also reduced in electric equipment by using as its display the light emitting device that can be manufactured inexpensively.

What is claimed is:

1. A method of manufacturing a light emitting device with an electrode formed over an insulating surface and an electro luminescence layer in contact with the electrode, the method comprising the steps of:

making an atmosphere in a processing chamber contain a first solvent;

pressurizing the processing chamber to reach a pressure equal to or higher than the atmospheric pressure; and forming the electro luminescence layer in the processing chamber, wherein the electro luminescence layer is formed by printing.

2. A method of manufacturing a light emitting device according to in claim 1, wherein the pressure in the processing chamber is 1.1 to 1.5 atm.

3. A method of manufacturing a light emitting device according to claim 1 wherein the electro luminescence layer is formed by one of letterpress, plate printing, and screen printing.

4. A light emitting device manufactured by a manufacturing method according to claim 1.

5. A light emitting device according to claim 4, wherein the light emitting device is a device selected from the group consisting of a display device, a digital camera, a notebook computer, a mobile computer, a portable image reproducing device that is provided with a recording medium, a goggle type display device, a video camera, and a cellular phone.

6. A method of manufacturing a light emitting device with an electrode connected to a semiconductor element and an electro luminescence layer in contact with the electrode, the method comprising the steps of:

making an atmosphere in a processing chamber contain a first solvent;

pressurizing the processing chamber to reach a pressure equal to or higher than the atmospheric pressure; and forming the electro luminescence layer in the processing chamber, wherein the electro luminescence layer is formed by printing.

7. A method of manufacturing a light emitting device according to in claim 6, wherein the pressure in the processing chamber is 1.1 to 1.5 atm.

8. A method of manufacturing a light emitting device according to claim 6 wherein the electro luminescence layer is formed by one of letterpress, plate printing, and screen printing.

9. A light emitting device manufactured by a manufacturing method according to claim 6.

10. A light emitting device according to claim 9, wherein the light emitting device is a device selected from the group consisting of a display device, a digital camera, a notebook computer, a mobile computer, a portable image reproducing device that is provided with a recording medium, a goggle type display device, a video camera, and a cellular phone.

11. A method of manufacturing a light emitting device comprising:

introducing a substrate in a chamber;

making an atmosphere in the chamber contain a first solvent; and forming an electro luminescence layer comprising an organic material by printing over the substrate in the atmosphere, wherein said electro luminescence layer is formed in said chamber at a pressure higher than the atmospheric pressure.

12. A method according to claim 11 wherein the pressure in the chamber is 1.1 to 1.5 atm.

13. A method according to claim 11 wherein the electro luminescence layer is formed by one of letterpress, plate printing, and screen printing.

14. A method of manufacturing a light emitting device comprising:

introducing a substrate in a chamber;

making an atmosphere in said chamber contain a first solvent; and printing a layer comprising an electro luminescence material dissolved in a second solvent over the substrate.

15. A method according to claim 14 wherein the pressure in the chamber is 1.1 to 1.5 atm.

16. A method according to claim 14 wherein the electro luminescence layer is formed by one of letterpress, plate printing, and screen printing.

17. A method according to claim 14 wherein the first solvent comprises the same material as the second solvent.

18. A method of manufacturing a light emitting device comprising:

introducing a substrate in a chamber;

making an atmosphere in said chamber contain a first solvent; and printing a layer comprising an electro luminescence material dissolved in a second solvent over the substrate, wherein the first solvent is provided in a tray placed in the chamber.

* * * * *